(12) United States Patent
Rappaport et al.

(10) Patent No.: US 7,295,960 B2
(45) Date of Patent: *Nov. 13, 2007

(54) SYSTEM AND METHOD FOR AUTOMATED PLACEMENT OR CONFIGURATION OF EQUIPMENT FOR OBTAINING DESIRED NETWORK PERFORMANCE OBJECTIVES

(75) Inventors: Theodore S. Rappaport, Austin, TX (US); Roger Skidmore, Austin, TX (US)

(73) Assignee: Wireless Valley Communications, Inc., Austin, TX (US)

( * ) Notice: Subject to any disclaimer, the term of this patent is extended or adjusted under 35 U.S.C. 154(b) by 727 days.

This patent is subject to a terminal disclaimer.

(21) Appl. No.: 10/386,943

(22) Filed: Mar. 13, 2003

(65) Prior Publication Data

US 2004/0143428 A1 Jul. 22, 2004

(51) Int. Cl.
*G06F 17/50* (2006.01)
*G06G 7/62* (2006.01)
*H04M 11/00* (2006.01)
*H04Q 7/20* (2006.01)

(52) U.S. Cl. .................. 703/13; 703/2; 455/403; 455/422.1; 455/423

(58) Field of Classification Search ............... 703/2, 703/13; 715/848; 455/403, 422.1, 423
See application file for complete search history.

(56) References Cited

U.S. PATENT DOCUMENTS 7,055,107 B1 * 5/2006 Rappaport et al. .......... 715/848

* cited by examiner

*Primary Examiner*—Paul Rodriquez
*Assistant Examiner*—Ayal Sharon

(57) ABSTRACT

A method is presented for determining optimal or preferred configuration settings for wireless or wired network equipment in order to obtain a desirable level of network performance. A site-specific network model is used with adaptive processing to perform efficient design and on-going management of network performance. The invention iteratively determines overall network performance and cost, and further iterates equipment settings, locations and orientations. Real time control is between a site-specific Computer Aided Design (CAD) software application and the physical components of the network allows the invention to display, store, and iteratively adapt any network to constantly varying traffic and interference conditions. Alarms provide rapid adaptation of network parameters, and alerts and preprogrammed network shutdown actions may be taken autonomously. A wireless post-it note device and network allows massive data such as book contents or hard drive memory to be accessed within a room by a wide bandwidth reader device, and this can further be interconnected to the internet or Ethernet backbone in order to provide worldwide access and remote retrieval to wireless post-it devices.

189 Claims, 20 Drawing Sheets

WIRELESS VALLEY SITE PLANNER (C:\SITEPLANNER\BOM\COMPONENTS.XML)

FILE

| TYPE | MANUFACTURER | PART # | DESCRIPTION | LOSS (dB PER 100 METERS) | CONNECTIONS | PHYSICAL COST (PER METER) |
|---|---|---|---|---|---|---|
| CONNECTOR | E-TRON | | TYPE N 10dB TAP | 0.50 | 2 | 300.00 |
| CONNECTOR | NARDA | 3372A-2 | TYPE N FEMALE 2-WAY POWER DIVIDER | 0.30 | 3 | 65.00 |
| ANTENNA_POINT | ALLEN TELECOM | ATSA110 | ATG UNITY GRAIN OMNI INDOOR ACTIVE LI... | 0.00 | 1 | 25.00 |
| CONNECTOR | E-TRON, N CONNECT... | | 10 dB MULTIFREQUENCY TAP | 0.50 | 2 | 20.00 |
| CABLE | RFS CABLEWARE | HCA78-50JFP | 7/8" AIR DIELECTRIC, PLENUM, CORRUGATED | 0.63 | 2 | 15.19 |
| CABLE | RFS CABLEWARE | LCF78-50JFRN | 7/8" FLEXWELL FOAM FIRE RETARDANT | 0.64 | 2 | 9.19 |
| CABLE | CELWAVE | 810929-001 | 7/8" FLEXWELL AIR DIELECTRIC CABLE | 7.10 | 2 | 3.71 |
| CABLE | ACME | 9983-A | FLEXMAX AIR DIELECTRIC | 13.00 | 2 | 2.69 |
| ANTENNA_POINT | ANTEL | LPD 7908 | 60 DEG. HOR. | 0.00 | 1 | 1.00 |
| ANTENNA_POINT | ANTEL | LPD 7907 | 80 DEG. HOR. | 0.00 | 1 | 1.00 |
| ANTENNA_POINT | ANTEL | LPD 7907/8 | 80 DEG. HOR. | 0.00 | 1 | 1.00 |
| ANTENNA_POINT | ANTEL | LPD 7905 | 92 DEG. HOR. | 0.00 | 1 | 1.00 |
| ANTENNA_POINT | ANTEL | LPD 7905/2 | 92 DEG. HOR. | 0.00 | 1 | 1.00 |
| ANTENNA_POINT | ANTEL | LPD 7905/8 | 92 DEG. HOR. | 0.00 | 1 | 1.00 |
| ANTENNA_POINT | ANTEL | BCR 80010:180 | DIRECTIONAL SPECIAL SHAPED PATTERN | 0.00 | 1 | 1.00 |
| ANTENNA_POINT | ANTEL | BCD 8007 | OMNI 15 DEG. VER. | 0.00 | 1 | 1.00 |
| ANTENNA_POINT | ANTEL | BCR 80010:270 | SPECIAL SHAPED PATTERN | 0.00 | 1 | 1.00 |
| ANTENNA_POINT | SWEDCOM CORPORA... | ALP8009 N20T | 80 DEG. 9 dB GAIN WITH 20 DEG. D/T | 0.00 | 1 | 0.00 |
| ANTENNA_POINT | ALLEN TELECOM | ASPP29331850 | dB OMNI PCN 1850-1990 360 DEG. 3 ← 402 | 0.00 | 1 | 0.00 |

FIG. 4

| TYPE | MANUFACTURER | PART # | DESCRIPTION | LOSS (dB PER 100 METERS) | CONNECTIONS | PHYSICAL COST (PER METER) |
|---|---|---|---|---|---|---|
| AMPLIFIER | CELLULAR SPECIALTIES | CSI-BDA110 | IN-BUILDING AMPLIFIER MODEL 110 SMR BAND | -40.00 | 2 | 0.00 |
| AMPLIFIER | CELLULAR SPECIALTIES | CSI-BDA110 | IN-BUILDING AMPLIFIER MODEL 110 SMR BAND | -30.00 | 2 | 0.00 |
| AMPLIFIER | CELLULAR SPECIALTIES | CSI-BDA110 | IN-BUILDING AMPLIFIER MODEL 110 SMR BAND | -20.00 | 2 | 0.00 |
| AMPLIFIER | CELLULAR SPECIALTIES | CSI-BDA120 | IN-BUILDING AMPLIFIER MODEL 120 SMR BAND 10... | -10.00 | 2 | 0.00 |

*FIG. 5*

SYSTEM AND METHOD FOR AUTOMATED PLACEMENT OR CONFIGURATION OF EQUIPMENT FOR OBTAINING DESIRED NETWORK PERFORMANCE OBJECTIVES

CROSS-REFERENCE TO RELATED APPLICATIONS

This application is related to U.S. Ser. No. 09/667,689 and U.S. Ser. No. 09/954,273, and the complete contents of these applications is herein incorporated by reference. The invention described is also related to U.S. Pat. No. 6,317,599, U.S. Pat. No. 6,442,507, U.S. Pat. No. 6,493,679, and U.S. Pat. No. 6,499,006 and the complete contents of these patents are herein incorporated by reference.

BACKGROUND OF THE INVENTION

1. Field of the Invention

The present invention generally relates to engineering and management systems for the design and on-going operation of wireless and wired communication networks or systems and, more particularly, to a method for determining and maintaining the proper configuration of wireless or wired network hardware in terms of power output, gain, attenuation, channel, frequency settings, throughput settings, antenna positioning or adjustments, adaptive control of transmission or reception parameters, adaptive control of coverage zones, handoff zones, user quality of service, overall performance of a class of users, in any environment (e.g., buildings, floors within a building, campuses, within cities, an outdoor setting, etc.) in order to achieve some optimal or preset or desired performance goals (e.g., signal-to-interference ratio (SIR), signal-to-noise ratio (SNR), quality of service for all users or particular classes of users, or individual users, received signal strength intensity (RSSI), throughput, bit error rate (BER), packet error rate (PER), capacity, billing efficiency, etc.) for the wireless or wired network users who are operating within or around the environment.

2. Background Description

As data communications use increases, radio frequency (RF) coverage within and around buildings and signal penetration into buildings from outside transmitting sources has quickly become an important design issue for network engineers who must design and deploy cellular telephone systems, paging systems, wireless or wired computer networks, or new wireless systems and technologies such as personal communication networks or wireless local area networks (WLANs). Similar needs are merging for wireless Internet Service Providers (WISPs) who need to provision and maintain wireless connections to their customers. Designers are frequently requested to determine if a radio transceiver location or base station cell site can provide reliable service throughout an entire city, an office, building, arena or campus. A common problem for wireless networks is inadequate coverage, or a "dead zone" in a specific location, such as a conference room. Such dead zones may actually be due to interference, rather than lack of desired signal. It is understood that an indoor wireless PBX (private branch exchange) system or wireless local area network (WLAN) can be rendered useless by interference from nearby, similar systems.

The costs of in-building and microcell devices which provide wireless coverage are diminishing, and the workload for RF engineers and technicians to install and manage these on-premises systems is increasing sharply. Rapid engineering design, deployment, and management methods for microcell and in-building wireless systems are vital for cost-efficient build-out and on-going operation. The evolving wireless infrastructure is moving toward packet-based transmissions, and outdoor cellular may soon complement in-building Wireless LAN technology. See "Wireless Communications: Past Events and a Future Perspective" by T. S. Rappaport, et al., IEEE Communications Magazine, June 2002 (invited); and "Research Challenges in Wireless Networks: A Technical Overview, by S. Shakkottai and T. S. Rappaport at Proceeding of the Fifth International Symposium on Wireless Personal Multimedia Communications, Honolulu, Hi., October 2002 (invited).

Analyzing and controlling radio signal coverage penetration, network quality of service, and interference is of critical importance for a number of reasons. As more and more wireless networks are deployed in greater capacity, there will be more interference and more management and control needed, which in turn will create a greater need to properly design, measure, and manage, on an on-going basis, the aggregate performance of these networks, using real time autonomous management systems as well as sporadic or periodic adjustments to the wireless infrastructure. Not only will there be a need for properly setting the channels and operating parameters of indoor networks in an optimal or sensible setting upon network turn-on, but real time control will also be needed to guarantee quality of service to different types of wireless users (different class of users), some who may pay a premium for guaranteed data delivery or a more robust form of wireless network access, and other users who may want a lower class of service and who do not wish to pay for premium bandwidth access or who only need intermittent access to the network. Provisioning the Radio Frequency (RF) resources will become more important as users increase and networks proliferate, and scheduling techniques and autonomous control of networks using simpler and more automated and embedded means will be critical for the success and proliferation of ubiquitous wireless networks.

When contemplating a wireless network, such as a Wireless LAN or cellular network to offer service to a group of mobile or portable users, a design engineer must determine if an existing outdoor large-scale wireless system, or macrocell, will provide sufficient coverage and/or capacity throughout a building, or group of buildings (i.e., a campus), or if new hardware is required within the campus. Alternatively, network engineers must determine whether local area coverage will be adequately supplemented by other existing macrocells, or whether and where, particularly, indoor wireless transceivers (such as wireless access points, smart cards, sensors, or picocells) must be added. The placement and configuration of these wireless devices is critical from both a cost and performance standpoint, and the on-going maintenance and management of the network and the management of the performance of users on the network is vital to ensure network quality, quality of service (QoS) requirements, as well as reliability of the wireless network as more users come on the network or install nearby networks.

If an indoor wireless system currently exists, and a new network in a nearby building, home, or urban area is suddenly installed by an unintended interfering neighbor (or worse yet, by an intentional or hostile jammer), there is clearly a need to adapt the network to properly avoid the interference and to maintain network quality. Adaptive techniques such as power control, adaptive antennas, and frequency hopping are well known and have been used for over a decade in the cellular radio and military radio communities. Some literature on the subject includes "Smart Antennas" by Liberti and Rappaport," Prentice-Hall, c. 1999, and "Wireless Communications: Principles and Practice" (2/e) by T. S. Rappaport, c. 2002.

Not only must judicious planning be done to prevent new wireless indoor networks from interfering with signals from an outdoor macrocell or other nearby indoor networks at the onset of network deployment, but the designer must currently predict how much interference can be expected and where it will manifest itself within the building, or group of buildings ahead of time the best he or she can. Also, providing a wireless system that minimizes equipment infrastructure cost as well as installation cost is of significant economic importance.

It should be clear that a rapid and adaptive method for properly determining operating characteristics of a multiple-transmitter network (such as a Wireless LAN with many access points across a campus) is not only needed in the original installation and start-up of a network, but that in addition, after a system or network is installed, there is a continued need to manage the installed network over time and space, on both an adaptive, real-time or near real time basis through adaptive control, as well as on an intermittent or periodic basis, so that managers, technicians, network owners, and building owners, home owners, etc. are able to record, monitor, and continually ensure proper network operation. At the same time, these individuals need to be able to properly document the installation, adjust the network performance as required over time, and keep track of maintenance records of the system, as well as track the cost, maintenance repairs, and ongoing performance of the system and the components that make up the system in an orderly manner, so that on-going operational data may be gathered, understood, aggregated and used for further maintenance and build-out of wireless networks and systems by those same parties. Even better would be an autonomous system that could automatically conduct such operational bookkeeping so that an indoor wireless network could constantly adapt to the growing and changing interference or environmental changes around it, without the homeowner or building owner even needing to be aware of the operational details.

Research efforts by many leading programs have attempted to model and predict radio wave propagation. Work by AT&T Laboratories, Brooklyn Polytechnic, and Virginia Tech are described in papers and technical reports entitled: S. Kim, B. J. Guarino, Jr., T. M. Willis III, V. Erceg, S. J. Fortune, R. A. Valenzuela, L. W. Thomas, J. Ling, and J. D. Moore, "Radio Propagation Measurements and Predictions Using Three-dimensional Ray Tracing in Urban Environments at 908 MHZ and 1.9 GHz," IEEE Transactions on Vehicular Technology, vol. 48, no. 3, May 1999 (hereinafter "Radio Propagation"); L. Piazzi, H. L. Bertoni, "Achievable Accuracy of Site-Specific Path-Loss Predictions in Residential Environments," IEEE Transactions on Vehicular Technology, vol. 48, no. 3, May 1999 (hereinafter "Site-Specific"); G. Durgin, T. S. Rappaport, H. Xu, "Measurements and Models for Radio Path Loss and Penetration Loss In and Around Homes and Trees at 5.85 GHz," IEEE Transactions on Communications, vol. 46, no. 11, November 1998; T. S. Rappaport, M. P. Koushik, J. C. Liberti, C. Pendyala, and T. P. Subramanian, "Radio Propagation Prediction Techniques and Computer-Aided Channel Modeling for Embedded Wireless Microsystems," ARPA Annual Report, MPRG Technical Report MPRG-TR-94-12, Virginia Tech, July 1994; T. S. Rappaport, M. P. Koushik, C. Carter, and M. Ahmed, "Radio Propagation Prediction Techniques and Computer-Aided Channel Modeling for Embedded Wireless Microsystems," MPRG Technical Report MPRG-TR-95-08, Virginia Tech, July 1994; T. S. Rappaport, M. P. Koushik, M. Ahmed, C. Carter, B. Newhall, and N. Zhang, "Use of Topographic Maps with Building Information to Determine Antenna Placements and GPS Satellite Coverage for Radio Detection and Tracking in Urban Environments," MPRG Technical Report MPRG-TR-95-14, Virginia Tech, September 1995; T. S. Rappaport, M. P. Koushik, M. Ahmed, C. Carter, B. Newhall, R. Skidmore, and N. Zhang, "Use of Topographic Maps with Building Information to Determine Antenna Placement for Radio Detection and Tracking in Urban Environments," MPRG Technical Report MPRG-TR-95-19, Virginia Tech, November 1995; S. Sandhu, M. P. Koushik, and T. S. Rappaport, "Predicted Path Loss for Roslyn, Va., Second set of predictions for ORD Project on Site Specific Propagation Prediction," MPRG Technical Report MPRG-TR-95-03, Virginia Tech, March 1995, T. S. Rappaport, et al., "Indoor Path Loss Measurements for Homes and Apartments at 2.4 and 5.85 GHz, by Wireless Valley Communications, Inc., Dec. 16, 1997; Russell Senate Office Building Study, Project Update, Roger R. Skidmore, et al., for Joseph R. Loring & Associates; "Assessment and Study of the Proposed Enhancements of the Wireless Communications Environment of the Russell Senate Office Building (RSOB) and Associated Utility Tunnels," AoC Contract # Acbr96088, prepared for Office of the Architect of the Capitol, Feb. 20, 1997; "Getting In," R. K. Morrow Jr. and T. S. Rappaport, Mar. 1, 2000, Wireless Review Magazine; and "Isolating Interference," by T. S. Rappaport, May 1, 2000, Wireless Review Magazine, "Site Specific Indoor Planning" by R. K. Morrow, Jr., March 1999, Applied Microwave and Wireless Magazine, "Predicting RF coverage in large environments using ray-beam tracing and partitioning tree represented geometry," by Rajkumar, et al, Wireless Networks, Volume 2, 1996.

The aforementioned papers and technical reports are illustrative of the state-of-the-art in site-specific radio wave propagation modeling. While most of the above papers describe a comparison of measured versus predicted RF signal coverage, or describe methods for representing and displaying predicted performance data, they do not report a comprehensive method for optimizing or adjusting the parameters of equipment settings such as power levels, channelization, or data rates, etc. within an environment to affect a desired behavior in an actual operating network or a planned network.

Furthermore, the above mentioned propagation papers do not teach a way to autonomously allow a network to be properly provisioned for the allocation of multiple classes of data users in a wireless network, nor do they teach any type of display of such performance or the comparisons of predicted versus measured performance that would be due to proper feedback of predicted performance results to the operational wireless infrastructure. While other prior art listed below considers network adaptive control and feedback based on simulation or preset specifications, no work has considered using a site-specific wireless environmental model, that allows a user to simultaneously view the physical environment, control network performance parameters, and see the performance of the network in an adaptive manner.

Additionally, no one has considered the importance of properly configuring, regulating, or controlling the wireless infrastructure in order to properly provision various classes of simultaneous wireless data users in an in-building network, where accurate site-specific propagation modeling is at the heart of driving and setting operating points of an in-building network, so that proper ongoing performance can be carried out in real-time or near real-time as the network changes over time and space. Clearly, this is crucial for on-going network performance as more users and more interfering networks proliferate.

The "Radio Propagation" and "Site-Specific" papers make reference to 3-D modeling, but do not offer novel methods for utilizing the 3-D modeling to carry out automatic equipment configurations or parameter adjustments, nor do they contemplate any type of autonomous control or feedback that uses the predictions to drive, in real time, the actual network performance. An effective method that allows a network communications technician or designers or building owners to automatically determine and visualize the proper configuration and settings of wireless or wired hardware equipment in a site-specific data management system, in a real time or simulated manner, in order to attain optimal or preset desired network performance criteria does not exist in the prior art.

Common to all wireless network and communication system designs as well as wired network designs is the desire to maximize the performance and reliability of the system while minimizing the deployment costs and maximizing on-going performance. Ways to minimize cost include the use of computer aided design tools that manage many aspects of the design process upon installation, and on a periodic basis after the network is operational. Such tools also help create methods that enable the engineer or technician to work quickly and to document their work for others in the organization (SitePlanner and LANPlanner are applications by Wireless Valley Communications, Inc. that provide these capabilities).

Consider a wireless network, for example. Analyzing radio signal coverage, quality of service, capacity, handoff or coverage zones, throughput, delay, signal strength or interference is of critical importance for a number of reasons. A design engineer must determine if an indoor environment that is a candidate for a wireless system contains too much noise or interference, or if the existing wireless system will provide sufficient signal power throughout the desired service area. Alternatively, wireless engineers must determine whether local area coverage will be adequately supplemented by existing large-scale outdoor wireless systems, or macrocells, or whether indoor wireless transceivers, WLAN access points, repeaters, or picocells, must be added. The ability to have adaptive control of the in-building access points so that they can be adjusted automatically in response to changes in the environment to provide improved performance in the face of interference or increased capacity or added users is a significant improvement. Even something as simple as adjusting the carrier frequency or channel of an access point to avoid a nearby jamming access point, adjusting the transmit power of an access point to increase or decrease the coverage area, adjusting the orientation or configuration of electrically steerable or smart antennas, or to throttle down the data rate because of microwave oven interference, could provide significant benefit to users of the network.

The placement and configuration of wireless and wired equipment, such as routers, hubs, switches, cell sites, cables, antennas, distribution networks, receivers, transceivers, transmitters, repeaters, or access points is critical from both a cost and performance standpoint. The design engineer must predict how much interference can be expected from other wireless systems and where it will manifest itself within the environment. In many cases, the wireless network interferes with itself, forcing the designer to carefully analyze many different equipment configurations in order to achieve proper performance. Sometimes power cabling is only available at limited places in a building or campus, thus decisions must be made with respect to the proper location and quantity of access points, and their proper channel assignments. Prediction methods which are known and which are available in the literature provide well-accepted methods for computing coverage or interference values for many cases.

Depending upon the design goals or operating preferences, the performance of a wireless communication system may involve tradeoffs or a combination of one or more factors. For example, the total area covered in adequate received or radio signal strength (RSSI), the area covered with adequate data throughput levels, and the numbers of customers that can be serviced by the system at desired qualities of service or average or instantaneous bandwidth allocations are among the deciding factors used by design engineers in planning the placement of communication equipment comprising the wireless system, even though these parameters change with time and space, as well as with the number and types of users and their traffic demands.

Until the current invention, an adaptive control environment based on site-specific performance prediction modeling for digital data networks, while relying upon real-time wireless network feedback and visual display capabilities for a performance basis, did not exist.

There are many computer aided design (CAD) products on the market that can be used to aid in some manner for wireless design or optimization, but none consider the in-building data scenario with site-specific control and autonomous feedback for network provisioning and scheduling in and around buildings and campuses. WiSE from Lucent Technology, Inc., SignalPro from EDX (now part of Comarco), PLAnet by Mobile Systems International, Inc., (later known as Metapath Software International, now part of Marconi, P. L. C.), decibelPlanner from Marconi, and TEMS from Ericsson, Wizard by Safco Technologies, Inc. (now part of Agilent Technologies, Inc.), are examples of CAD products developed to aid in the design of wireless communication systems.

Agilent Technologies offers Wizard as a design tool for wireless communication systems. The Wizard system predicts the performance of macrocellular wireless communication systems based upon a computer model of a given environment using statistical, empirical, and deterministic predictive techniques.

Lucent Technologies, Inc., offers WiSE as a design tool for wireless communication systems. The WiSE system predicts the performance of wireless communication systems based on a computer model of a given environment using a deterministic radio coverage predictive technique known as ray tracing.

EDX offers SignalPro as a design tool for wireless communication systems. The SignalPro system predicts the performance of wireless communication systems based on a computer model of a given environment using a deterministic RF power predictive technique known as ray tracing.

WinProp offers a Windows-based propagation tool for indoor network planning made by AWE from Germany, and CINDOOR is a European university in-building design tool.

Marconi, P. L. C., offers both PLAnet and decibelPlanner as design tools for wireless communication systems. The PLAnet and decibelPlanner systems predict the performance of macrocellular and microcellular wireless communication systems based upon a computer model of a given environment using statistical, empirical, and deterministic predictive techniques. PLAnet also provides facilities for optimizing the channel settings of wireless transceivers within the environment, but does not provide for further adaptive transceiver configurations beyond channel settings.

Ericsson Radio Quality Information Systems offers TEMS as a design and verification tool for wireless communication indoor coverage. The TEMS system predicts the performance of indoor wireless communication systems based on a building map with input base transceiver locations and using empirical radio coverage models. Teleworx developed an Automatic Frequency Planning Tool (AFP) as announced in January 1999 Wireless Review Magazine, and other corporations such as CelPlan and Safco have implemented Automated Frequency Planning that iteratively determines good channel assignments for transmitters in cellular radio systems.

The above-mentioned design tools have aided wireless system designers by providing facilities for predicting the performance of wireless communication systems and displaying the results primarily in the form of flat, two-dimensional grids of color or flat, two-dimensional contour regions. None of the aforementioned design tools have an automated facility for determining the ideal configurations or establishing pre-set operating points for wireless LAN transceivers or other data-centric modems modeled in a site-specific environment in order to achieve some optimal or desired overall or individual network performance. Furthermore, none of the aforementioned design tools contemplate an automated facility for determining the ideal configurations for wireless data transceivers modeled in a 3-D environment in order to achieve some optimal network performance, while simultaneously displaying the physical location of network assets on a site-specific model of the physical environment.

In addition to the aforementioned design tools, there are several commercially available products that provide the facility for determining optimal transceiver channel settings. Optimizer™ from Schema Ltd., ScoreBoard™ from ScoreBoard Inc., OPAS32 from Agilent Technologies, and E-NOS from Actix are representative of the state-of-the-art in wireless network optimization from the standpoint of frequency planning primarily in the cellular and PCS environments.

Schema Ltd. provides the Optimizer™ software application to assist in the planning and allocation of channels among a specified set of transceivers on a given wireless network. Optimizer™ utilizes measurement information collected either from mobile receivers roaming throughout the coverage area of an existing network or measurement information obtained through monitoring traffic from each transceiver of an existing network. By analyzing the measurement information, Optimizer™ attempts to determine the optimal allocation of channels and/or frequencies across all transceivers participating in the analysis in order to improve the performance of the network. Optimizer™, however, does not consider the physical environment or the detailed specifications or site-specific placements or interconnections of equipment involved in the network, thereby failing to offer the added benefit of visualization of network configuration (valuable for design, deployment, and on-going maintenance, since indoor wireless antennas are often hidden), and further suffering from less accurate modeling since site-specific data is not used by the application. In addition, because Optimizer™ requires measurement data from an existing network, it is not applicable to networks being planned and not yet deployed.

ScoreBoard Inc. provides ScoreBoard™, a comprehensive software solution that assists in the planning and allocation of channels or frequencies among a specified set of transceivers on a given wireless network. ScoreBoard utilizes measurement information collected either from mobile receivers roaming throughout the coverage area of an existing network or measurement information obtained through monitoring traffic reported by transceivers in an existing network. By analyzing the measurement information, ScoreBoard attempts to determine the optimal allocation of channels and/or frequencies across all transceivers participating in the analysis in order to improve the performance of the network. ScoreBoard™, however, does not consider the physical environment or the detailed specifications or site-specific placements or interconnections of equipment involved in the network, thereby failing to offer the added benefit of visualization of network configuration (valuable for design, deployment, and on-going maintenance since indoor network components such as antennas are often hidden), and further suffering from less accurate modeling since site-specific propagation or environmental data is not used by the application. In addition, because ScoreBoard™ requires measurement data from an existing network, it is not as applicable to networks being planned and not yet deployed.

Agilent Technologies provides OPAS32, analysis software that assists in the planning and allocation of channels among a specified set of transceivers on a given wireless network. OPAS32 utilizes measurement information collected from mobile receivers roaming throughout the coverage area of an existing network. By analyzing the measurement information, OPAS32 attempts to determine the optimal allocation of channels and/or frequencies across all transceivers participating in the analysis in order to improve the performance of the network. OPAS32, however, does not consider the physical environment or the detailed specifications or site-specific placements or interconnections of equipment involved in the network, thereby failing to offer the added benefit of visualization of network configuration (valuable for design and on-going maintenance), and further suffering from less accurate modeling since site-specific data is not used by the application. In addition, because OPAS32 requires measurement data from an existing network, it is not applicable to networks being planned and not yet deployed.

Actix provides the E-NOS™ analysis software that assists in the planning and allocation of channels among a specified set of transceivers in a given wireless network. E-NOS™ utilizes measurement information collected from mobile receivers roaming throughout the coverage area of an existing network. By analyzing the measurement information, E-NOS™ attempts to determine the optimal allocation of channels and/or frequencies across all transceivers participating in the analysis in order to improve the performance of the network. E-NOS™, however, does not consider the physical environment or the detailed specifications or site-specific placements or interconnections of equipment involved in the network, thereby failing to offer the added benefit of visualization of network configuration (valuable for design and on-going maintenance), and further suffering from less accurate modeling since site-specific data is not used by the application. In addition, because E-NOS™ requires measurement data from an existing network, it is not applicable to networks being planned and not yet deployed.

Visionael is a network management software company that provides auditing and documentation capabilities for wired data communication networks. Visionael does not use site-specific environmental information or wireless prediction methods for predicting or measuring network performance, nor do they provide support for predicting, measuring, optimizing or controlling parameters that are fundamental to wireless networks. Furthermore, they do not provide means for controlling a wide range of wireless network users for desired performance throughout a network.

In addition, various systems and methods are known in the prior art with the regard to the identification of the location of mobile resources or clients currently roaming on a wireless network. Such systems and methods are generally referred to as position location techniques, and are well-known in the field for their ability to use the RF characteristics of the transmit signal to or from a mobile device as a determining factor for the position of the mobile device. Various papers such as P. Bahl, V. Padmanabhan, and A. Balachandran, "A Software System for Locating Mobile Users: Design, Evaluation, and Lessons," April 2000, present various techniques for doing position location. The present invention provides significant benefit to the field of position location by enabling the a priori determination of the RF propagation and channel environment within the facility without the need for exhaustive measurement campaigns. The predictive capability of the invention enables the RF channel characteristics—a vital factor in position location algorithms and techniques—to be determined very quickly and accurately. The measurement capability of the invention allows signal measurements to be made from portable client users. The predictive and measurement results can be processed and then be mapped onto a site-specific model of the environment for ready use in carrying out position location displays, and studies or analysis of location-specific data.

SUMMARY OF THE INVENTION

Until the present invention, it has not been possible for a wireless network technician or manager to design a network ahead of time with a particular site-specific design application, and then use that same application for real-time or near real-time design, management and control of that same network. The current invention provides a significant value to the networking community, since original documentation and knowledge created during the design phase can now be reused time and again with no additional effort, in the same application for network control and smart network management. Thus, the invention provides a new kind of network application that enables complete management, measurement, design, and maintenance for any wireless network in an on-going, seamless, and adaptive manner.

As in-building wireless LANs and microcell wireless systems proliferate, all of the issues facing network installers, carriers, and network technicians may now be resolved quickly, easily, and inexpensively using the current invention. Just as CAD tools are used by engineers and IT professionals to design and deploy a wireless network by considering the performance of components while they also consider multiple, potentially unrelated, factors before the actual deployment of a network, we now disclose a novel method and system that uses powerful CAD capabilities with adaptive algorithms and real time communication links to provide a computational engine for network control and provisioning of wireless data networks, after the network is installed using the same application. The current invention displays network performance while providing adaptive control of network performance in a manner easily interpretable by network engineers or technicians. With the present invention, it becomes possible for a user to visualize and set network performance requirements, while the invention provides simulations that in turn provide feedback signals to the wireless hardware under control for proper network adjustments that are adjusted in real-time or in a delayed fashion to meet the newly described network conditions derived from simulation.

Two dimensional (2-D) and three dimensional (3-D) visualization of wireless system operating parameters, desired operating performance values and/or metrics, and actual measured operating metrics provided in a site-specific model of a network environment provides the user with rapid assimilation of large data sets and their relation to the physical environment, as well as with a control mechanism by which to alter network performance.

As wireless systems proliferate, the current invention promises to vastly improve the capabilities of network operations, by providing a low cost, seamless application that can be used during design and then again during on-going real-time management of any network. The invention may be bundled with any PC or handheld application, or even embedded within a wireless integrated circuit or chip set, to allow site-specific remote control and autonomous adjustment of access points and wireless hardware with the CAD controlling software, in order to provide desired predicted or pre-specified site-specific performance requirements in actual operating networks.

The invention may be implemented on a single user computer, such as personal computer, or it may alternatively be implemented in a distributed manner, such that control/GUI portion of the invention may operate on one computer, and part of the invention for a particular piece of equipment or device may operate on either another computer or may be implemented in many ways within a device. For example, the control/GUI part of the invention may ship as executable files on a standard PC or handheld computer application, and part of the invention may be implemented on a chip (an integrated circuit or circuits) or as embedded software or as a series of computing instructions combined with memory, wherein the memory or chip contains or may receive an electronic upload of a site-specific map of the components and wireless infrastructure that is controllable by the invention. It is possible that more than one computer can provide control/GUI capabilities, so that the invention may be mass duplicated and configured to operate, in part, with every laptop or PC, and control any number of components in a generic network deployed by the customer of many laptops, for example. Using an embedded map of the network architecture layout along with a map of the physical environment and the infrastructure layout, interconnections, cost data, and maintenance data, the invention allows for measurements or control signals to be compared in real time or off-line with prediction models. Further, the invention utilizes adaptive algorithms to provide control signals and communications that are sent to or from components within the network.

Alternatively, embedded software or a chip implementation may be programmed for use in the remote wireless transceiver or other infrastructure hardware, where such embedded software or chip implementation then enables the computerized CAD application (presumably operating from a network console or other central location, although the CAD application itself could also be portable or distributed) to communicate with network hardware as necessary to cause the hardware to adjust its settings, configuration, position, and other controllable parameters to affect the desired network performance as dictated by the computerized CAD application.

One embodiment of the current invention uses the site-specific computer aided design environment pioneered by Wireless Valley in concert with a real time or near real time communication linkage to actual wireless devices and components (such as wireless access points, amplifiers, repeaters, etc.) so that the computer aided design environment may be used as a powerful visual display, but also as a computational engine that generates predictions and then allows for feedback and adjustment of parameters in the wireless network infrastructure through the comparison and systematic evaluation of measured performance reported by the wireless infrastructure, and the predicted performance provided by the computer aided design application. In this manner, the CAD software allows the adjustment of multiple transmission points to achieve a desired overall or specific performance metric specified by the user or as set within the CAD software. Such adaptive control using site-specific modeling is novel for wireless networks in and around buildings with varying user classes, but is vital to future networks as they become Internet-based (packet based) as well as circuit-switched based. This may be done in an off-line simulation (design) mode, but also may be performed in a real-time or near real-time control mode, where the measured signal or interference levels (or other measured parameters) are sensed and used to iterate the proper reconfiguration of actual network hardware connected to the invention. Thus, the present invention serves as an adaptive controller and Graphical User Interface (GUI) for an in-building or campus or wide area wireless network, to ensure proper network operations as users enter and leave the network, or as new tenants install new access points in an uncoordinated fashion.

The current invention is also valuable for controlling a Wireless LAN network, for example, that supports several simultaneous users, some who paid for premium access (say for Voice over IP where delays are not tolerated by customers) and others who paid for low-grade wireless access (say for e-mail or paging data access), or for controlling and adaptively adjusting parameters of network equipment to minimize interference or to coordinate networks within a building or campus for proper performance and data access provisioning.

It is therefore an object of the present invention to facilitate the automated determination of desirable configuration settings for one or more wireless transceivers and other network hardware in a communication system, based on the desired network performance requirements, the real time radio frequency environmental conditions and user activities in the network, and specifications and capabilities of the infrastructure hardware, which include: manufacturer, model number of the device, transmit or receive power settings, input and output gain settings, channel or frequency settings and/or channel lists, bandwidth of transmitted or received signal, modulation scheme, data or symbol rate, protocol stack, coding, user priority settings or allowances, antenna pointing or phasing parameters, location of component, orientation of component, cost of component, maintenance cost of component, gain, loss, or any other parameter configurable for a given piece of equipment. The desirability of configuration settings are determined by identified performance goals for the communications network, such as overall coverage, overall capacity, specific coverage for a user class, specific capacity for a user class, coverage for a subset of users, capacity for a subset of users, handoff rate, dropped call rate, blocked call rate, dropped packet rate, symbol error rate, symbol rate, acceptable coverage zones, throughput (average, peak, individual, group, class or subclass, bit error rate, packet error rate, frame error rate, signal level, quality of service, or any other measurable performance metric, where such performance metrics may be specified, simulated, set, and adapted to for a particular user, a group of users of a particular user class, a composite collection of users from one or more classes or subclasses, or a fraction or entire user pool within a network.

It is another object of the present invention to provide a mechanism by which one or more wireless transceivers and other network infrastructure components communicate with a controlling computer or computers, where a site-specific CAD application capable of predicting, displaying, measuring, and monitoring network performance, maintaining cost and maintenance records, and providing visual capabilities of such data is available for network control on said controlling computer or computers, in either a stand-alone or distributed manner.

It is another object of the present invention to provide a mechanism for displaying, logging, storing, and reporting the desirable configuration settings and/or measured setting for said transceivers and other infrastructure hardware in a communication network.

It is another object of the present invention to perform said automated determination of desirable configuration settings for transceivers and other network hardware in a communication network within a site-specific database that involves a part of one building or a plurality of building structures and the surrounding terrain, flora, man-made items, climatic conditions, and additional static and dynamic obstacles.

It is another object of the present invention to perform automated determination of desirable configuration settings for one or more transceivers or hardware components in a communication network within a site-specific database that involves measurements of performance, and at least a part of one or more building structures and the surrounding terrain, flora, man-made items, climatic conditions, and additional static and dynamic obstacles utilizing site-specific radio wave propagation prediction techniques and environmental models of the site-specific physical environment.

It is another object of the present invention to update the configuration (e.g. equipment settings) of the actual network infrastructure (such as wireless access points, transceivers, sensors, multiple input-multiple output (MIMO) systems, switches, routers, repeaters, antennas, etc,) in the communications network involved in the analysis for optimal or preferred or desired configuration, said configuration update occurring through communications of control and data signals between the site-specific CAD application and the actual network infrastructure, whereas the communication of control and data signals occurs using the Internet, SMNP, wireless, infrared, or some other data communication, communication protocol, or electronic medium, in either a real time or non-real time manner and in either a synchronous or asynchronous manner.

It is another object of the present invention to provide a single CAD design, measurement, maintenance, and optimization application that can be used in pre-bid, design, deployment, and on-going real-time network management and maintenance applications with no additional software requirements, and which can be provided to users en-mass through distribution on personal computers and/or as embedded in communication network devices.

It is another object of the present invention to provide a downloadable model of the site-specific environmental model, including some or all of hardware component data, maintenance data, cost data, measurement capabilities, performance prediction capabilities, optimization capabilities, and adaptive control capabilities which exist in the simulated CAD environment, into a PC or handheld or chip-level device, so that the on-going management and control of networks may be carried out in real time or non-real time using a portable or embedded mechanism that is shippable in virtually every wireless access point, wireless transceiver, network hardware device, or PC.

It is another object of the present invention to provide a remote monitoring means, whereby measured network performance characteristics can be passed to a CAD software application from one or more remote network infrastructure components, and where such remote monitoring provides measured performance metrics or cost or maintenance data which may be displayed, logged, stored, or compared with predicted simulations or budgetary forecasts by the CAD software application.

It is another object of the present invention to provide a means by which the CAD software application may obtain measurements of network performance characteristics independent of measurements made by network infrastructure hardware.

It is another object of the present invention to provide an iterative and adaptive mechanism by which the network infrastructure hardware may be adjusted as needed, periodically, or upon demand by a user or by preset or preferred conditions, in order to meet a prescribed performance objective or objectives for the entire network.

It is another object of the present invention to provide an iterative and adaptive mechanism by which the computer models of the network infrastructure hardware may be adjusted or revised in order to meet a prescribed performance objective or objectives for the entire modeled network.

It is another object of the present invention to provide and support position location determination of mobile or portable wireless users, through measurement of signals by network equipment or by prediction of position location using site-specific propagation prediction models, in a fashion that allows the display of estimated position locations of wireless users.

According to the present invention, a system is provided for allowing a communication network designer, technician, or wireless network user to dynamically model a wired or wireless system electronically in any environment. The method includes the selection and placement of models of various wireless or optical or baseband communication system hardware components, such as antennas (point, omnidirectional, directional, adaptive, leaky feeder, distributed, etc.), base stations, base station controllers, amplifiers, cables, splitters, attenuators, repeaters, wireless access points, couplers, connectors, connection boxes, splicers, switches, routers, hubs, sensors, transducers, translators (such as devices which convert between RF and optical frequencies, or which convert between RF and baseband frequencies, or which convert between baseband and optical frequencies, and devices which translate energy from one part of the electromagnetic spectrum to another), power cables, twisted pair cables, optical fiber cables, and the like, as well as MIMO systems, and allows the user to visualize, in three-dimensions, the effects of their placement and movement on overall system performance throughout the modeled environment. For the purposes of this invention, the term "transceiver" shall be used to mean any network component that is capable of generating, receiving, manipulating, responding to, passing along, routing, directing, replicating, analyzing, and/or terminating a communication signal of some type. Thus, the placement of components can be refined and fine-tuned prior to actual implementation of a system or network, wherein performance prediction modeling or measurement may be used for design and deployment; and to ensure that all required regions of the desired service area are blanketed with adequate connectivity, RF coverage, data throughput, or possess other required network system performance values, such as acceptable levels of quality of service (QoS), packet error rate, packet throughput, packet latency, bit error rate, signal-to-noise ratio (SNR), carrier-to-noise ratio (CNR), signal strength or RSSI, rms delay spread, distortion, and other commonly used communication network performance metrics, known now or in the future, which may be measured or predicted and which may be useful for aiding an engineer in the proper installation, design, or ongoing maintenance of a wired or wireless communications network. In the case of an optical or baseband wired network, for example, the placement and performance of components can be visualized within the invention to ensure that proper portions of the environment are supplied with service, so that users within the environment may connect directly (with a hardwired connection) or via a wireless or infrared connection which can be provided throughout the wired network using translators, converters, wireless access points, and other communication components that facilitate frequency translation and wireless access from the wired network. The 2-D and 3-D visualization of system performance provides network designers and maintenance personnel with tremendous insight into the functioning of the modeled wireless or wired communication system, and represents a marked improvement over previous visualization techniques.

To accomplish the above, a 2-D or 3-D site-specific model of the physical environment is stored as a CAD model in an electronic database. This model may be extensive and elaborate with great detail, or it may be extremely simple to allow low cost and extreme ease of use by non-technical persons wanting to view the physical layout of the network. The physical, electrical, and aesthetic parameters attributed to the various parts of the environment such as walls, ceilings, doors, windows, floors, foliage, buildings, hills, and other obstacles that affect radio waves or which impede or dictate the routing of wiring paths and other wired components may also stored in the database. A representation of the environment is displayed on a computer screen for the designer to view. The designer may view the entire environment in simulated 3-D, zoom in on a particular area of interest, or dynamically alter the viewing location and perspective to create a "fly-through" effect.

Using a mouse or other input positioning device, the designer may select and view various communication hardware device models that represent actual communication system components from a series of pull-down menus. A variety of amplifiers, cables, connectors, and other hardware devices described above which make up any wired or wireless communication system or network may be selected, positioned, and interconnected in a similar fashion by the designer to form representations of complete wireless or wired communication systems. U.S. Pat. No. 6,493,679 entitled "Method and System for Managing a Real-Time Bill of Materials" awarded to Rappaport et al sets forth a preferred embodiment of the method for creating, manipulating, and managing the communication system infrastructure as modeled in the CAD software application.

In the present invention, the designer may use the invention to perform calculations to predict the performance of the communications network modeled within the environment. Performance is defined by any form of measurable criteria and includes, but is not limited to, adequate connectivity, RF coverage, data throughput, or required network system performance values, such as acceptable levels of quality of service (QoS), packet error rate, packet throughput, packet latency, bit error rate, signal-to-noise ratio (SNR), carrier-to-noise ratio (CNR), signal strength or RSSI, desired rms delay spread, distortion, and other commonly used communication network performance metrics, known now or in the future. The method presented additionally provides a means for visualizing the predicted performance values overlaid onto and/or embedded within the site-specific model of the environment. The present invention extends the prior art in this area by allowing a designer a quick, 3-D view of performance data overlaying the environment model. U.S. Pat. No. 6,317,599 entitled "Method and System for Automated Optimization of Antenna Positioning in 3-D" awarded to Rappaport et al. sets forth a preferred embodiment of the method for predicting the performance of a communications network within a site-specific model of the environment.

Through novel techniques provided by the present invention, the performance of a proposed or existing communications network within a particular environment can be improved through automated analysis. The user may specify particular desired operating characteristics or criteria, or these may be preset or preferred within the invention by the last user or by others who establish the set-up profile for users of the invention. The present invention predicts the performance of the communications network modeled in the site-specific environment, with all equipment first in a specific configuration. Then, the configuration of each piece of equipment is iterated, in either real time or non-real time, through a set of possible configuration settings, either defined by the user, defined by the specific equipment, or selected by the invention based on a sensed or a priori knowledge of the specified equipment, and the performance of the network is then recomputed by the invention.

For example, when not in real-time control mode, the present invention can simulate a network by reconfiguring a particular transceiver to have a different set of channels allocated to it, or it can replace a transceiver with one from a different manufacturer that has different operating characteristics, power levels, antenna patterns or orientations, or different channels, etc. Once all possible configurations have been analyzed, through iterative methods or genetic algorithms or some other method, the desired operating criteria are achieved, or the user decides to terminate the search, the equipment configurations that provide the most desirable network performance is displayed by the invention, and may also be stored for documentation purposes. The desired network configuration is preferably also stored in the bill of materials and a complete cost breakdown is provided for display and stored for future use. This data may also be communicated partially or in full to each network infrastructure component for storage and later retrieval in the network.

In addition, desired network configuration information may be transmitted and stored in some external database utilized for the generation of work orders, maintenance instructions, troubleshooting information, or accounting information. In this case, the invention is capable of automating the workflow of an organization by automatically or through user-intervention generating and issuing work orders for system engineers, IT managers, maintenance personnel, and technicians with regard to desired network configuration changes, and then notifying or updating the appropriate accounting records to reflect the cost of the new network configuration, including the replacement or discarding of old or damaged network hardware and the addition of new network hardware.

When the invention is used with actual hardware configured to the CAD application, iterative analysis using brute force or genetic algorithms can lead to proper hardware settings for each transceiver in the network, and the actual hardware is then controlled in order to achieve the desired network performance. This analysis is based upon predicted performance criteria within a computerized representation of an environment at the CAD application. Note that this invention may be used purely for automated "what-if" designs without actual control of the equipment, or may also be instituted with actual network hardware operating in the environment. Furthermore, iteratively adjusting the settings of the wireless hardware may be performed in real time, non-real time or delayed real time, or may be suppressed until the user is actually ready to implement the desired network hardware settings. Also, it is clear that further iterations might be advisable or necessary after the invention achieves its first round of network configuration settings that meet the performance criteria, as further improvements may be desirable or necessary.

In addition, if the communications network represented within the computer model of the environment is already in place, and the equipment within the communications network is ready to be re-configured through some controlling means, the present invention provides the capability of configuring the equipment within a communications network to have the configuration settings identified as a result of the analysis/simulation. Once the invention has determined, through the automatic process described above or by other means, the configuration settings for a given piece of equipment that allows a more desirable level of network performance, the invention can communicate with the physical equipment in the infrastructure via slow or fast control channels or data channels over the air, or via the Internet or through SMNP or some other data communication medium or protocol, and send the equipment the new configuration settings it should set for itself. Through this means, the entire communications network may be re-configured either automatically or through user interaction to achieve a different level of desired performance, and has the advantage of "self healing" when additional users or increased interference occurs in the network. In the case that the network is unable to achieve the original specification for desired performance, a default or failsafe list of settings may reside in memory in the CAD application or in the wireless hardware infrastructure to ensure the network does not become unstable.

BRIEF DESCRIPTION OF THE DRAWINGS

The foregoing and other objects, aspects and advantages will be better understood from the following detailed description of a preferred embodiment of the invention with reference to the drawings, in which:

FIG. 4 is an example pick list of equipment types;

FIG. 5 is and example pick list of equipment configurations;

DETAILED DESCRIPTION OF A PREFERRED EMBODIMENT OF THE INVENTION

Using the present method, it is now possible to improve the performance and ongoing management of a communication network to a much higher level of precision than previously possible, at substantially reduced cost and complexity. The present method is a significant advance over the prior art in the automated use of predicted or measured performance metrics to determine and drive a preset, desired, or optimal or preferred configuration of communication system infrastructure. The invention provides significant cost savings through the use of software that may used in many different phases of the life cycle of a network, while providing simultaneous capabilities in design, performance prediction, remote monitoring, and adaptive simulation and control of wireless infrastructure. The design of communication systems is often a very complex and arduous task, with a considerable amount of effort required to simply analyze the results of system performance.

Figure 1:
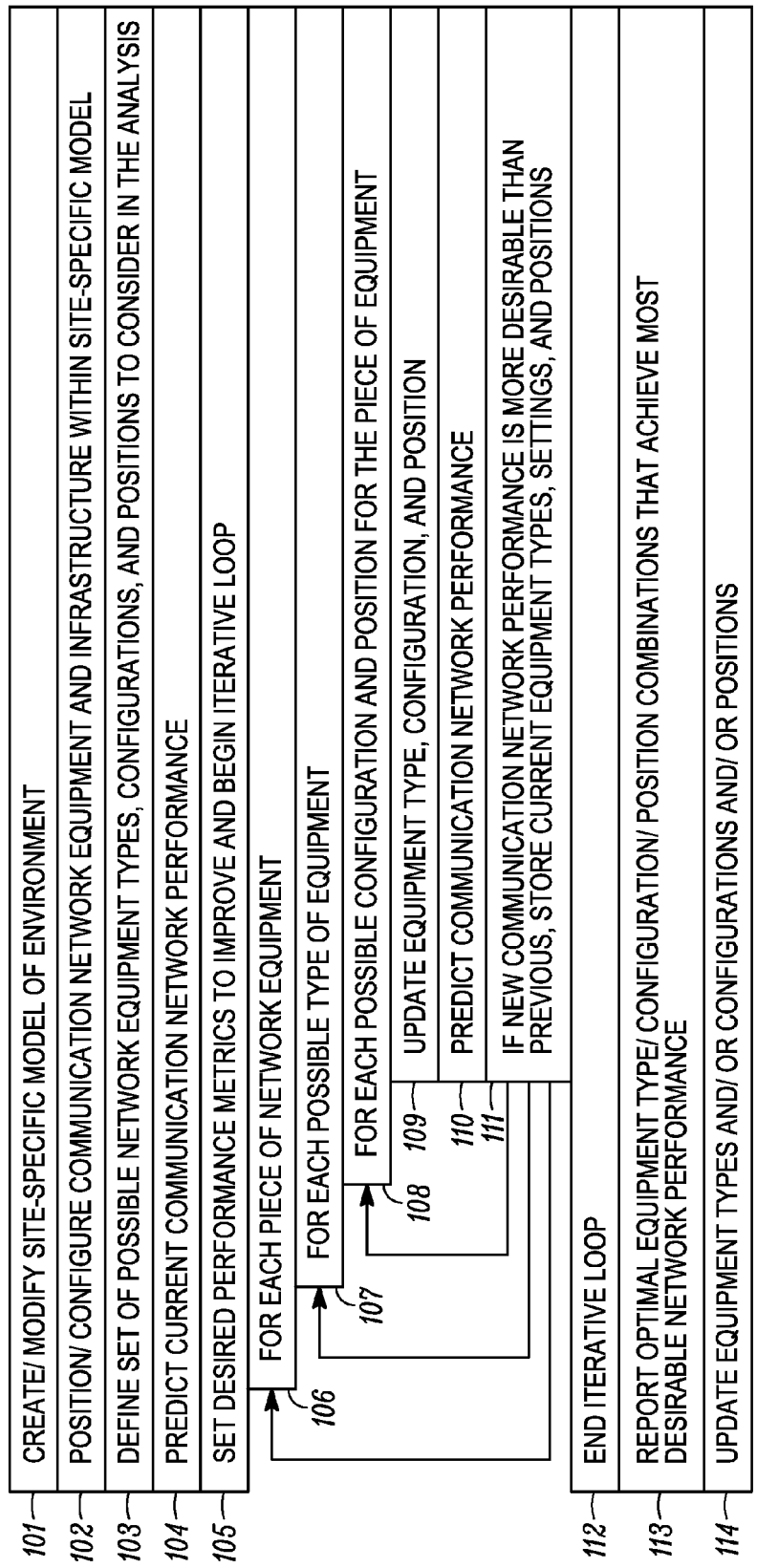
FIG. 1 shows a flow diagram showing process steps employed in the invention.

Referring now to FIG. 1, there is shown the general process of the present method. In order to begin analyzing a communication network, a site-specific computer representation of the environment in which the communication network is or will be deployed is created 101. The present invention uses 2-D or 3-D computer aided design (CAD) renditions of a part of a building, a building, or a collection of buildings and/or surrounding terrain and foliage. However, any information regarding the environment is sufficient, including 2-D or 3-D drawings, raster or vector images, scanned images, or digital pictures. The site-specific information is utilized by the present invention to enable visualization and relatively precise positioning of the communications infrastructure and to provide a model of the environment sufficient for performing visualizations that show the user measurements and/or predictions of network performance.

According to the invention, there is provided digital site-specific information regarding terrain elevation and land-use, building positions, tower positions, as well as geometries, height, and the internal layout of the walls, doors, ceilings, floors, furniture, and other objects within buildings, where the digital information may be in separate data formats or presentations, including two- or three-dimensional raster or vector imagery, and are combined into a single, three-dimensional digital model of the physical environment. Alternately, a series of 2-D images may be collected to represent the 3-D environment. The resulting three-dimensional digital model combines aspects of the physical environment contained within the separate pieces of information utilized, and is well suited for any form of display, analysis, or archival record of a wireless communication system, computer network system, or may also be used for civil utilities planning and maintenance purposes to identify the location of components, as well as their costs and specifications and attributes.

Figure 2:
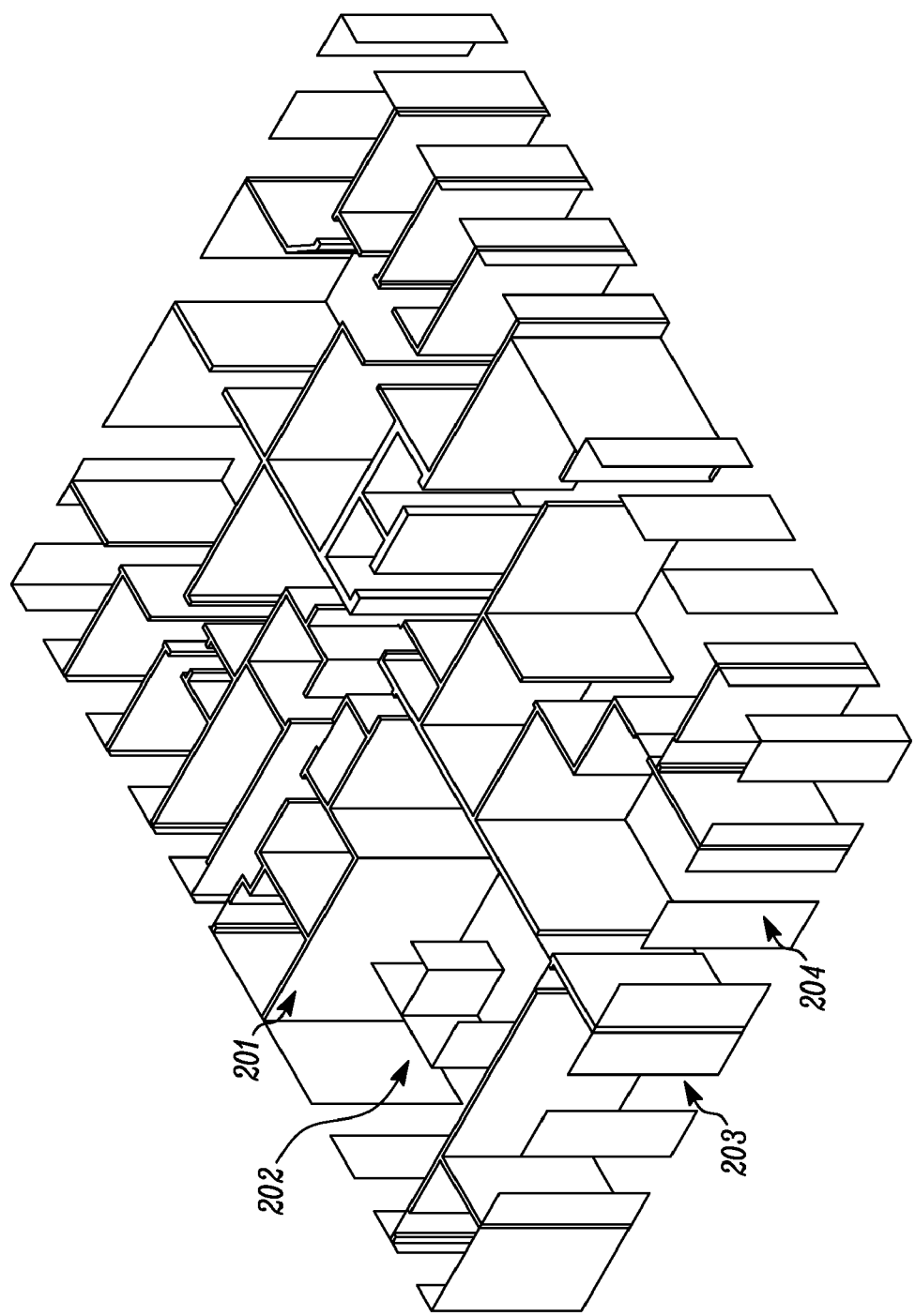
FIG. 2 is a three dimensional perspective of a building floor plan.

An example of a building environment as represented in the present invention is shown in FIG. 2. The various physical objects within the environment such as external walls 204, internal walls 201, cubicle walls 202, and windows 203 are represented within the model. Although a single floor of one building is shown for simplicity, any number of multi-floored buildings (or portions thereof) and the surrounding terrain may be represented within the invention. Any form of obstruction or clutter that could impact or alter the performance or physical layout of a communications network can be represented within the present invention. The electrical, mechanical, aesthetic characteristics of all obstructions and objects within the modeled environment may also be input and utilized by the invention. Such data is beneficial for improving the accuracy of performance predictions in wireless networks. For example, for wireless communication system design, the relevant information for each obstruction includes but is not limited to: material composition, size, position, surface roughness, attenuation, reflectivity, absorption, and scattering coefficient. For example, outside walls 204 may be given a 10 dB attenuation loss, signals passing through interior walls 201 may be assigned 3 dB attenuation loss, and windows 203 may show a 2 dB RF penetration loss.

This invention also enables a user to specify other physical, electrical, electromagnetic, mechanical, and aesthetic characteristics of any surface or object within the three-dimensional model. These characteristics include but are not limited to: attenuation, surface roughness, width, material, reflection coefficient, absorption, color, motion, scattering coefficients, weight, amortization data, thickness, partition type, owner and cost. In addition, information that is readily readable or writeable in many widely accepted formats, can also be stored within the database structure, such as general location data, street address, suite or apartment number, owner, lessee or lessor, tenant or ownership information, model numbers, service records, maintenance records, cost or depreciation records, accounting records such as purchasing, maintenance, or life cycle maintenance costs, as well as general comments or notes which may also be associated with any individual surface or building or object or piece of infrastructure equipment within the resulting three-dimensional model of the actual physical environment.

Note that all of these types of data specified in the preceding paragraphs typically reside in a computer CAD application which has the ability to iteratively or autonomously compute alternative communication network configurations of all network equipment, based on preset or user-specified design or operating points. However, these data records may also be digitized and passed between and/or stored at individual pieces of hardware equipment in the network for storage or processing at each particular piece of equipment.

Estimated partition electrical properties loss values can be extracted from extensive propagation measurements already published, which are deduced from field experience, or the partition losses of a particular object can be measured directly and optimized or preferred instantly using the present invention combined with those methods described in the U.S. Pat. No. 6,442,507 which is hereinincorporated by reference.

Referring once more to FIG. 1, once the appropriate site-specific model of the environment has been specified 101, any desired number of hardware components, communications infrastructure, or equipment can be positioned, configured, and interconnected in the site-specific model 102. The communications network is site-specifically modeled within the invention by manual or automatic means, whereby the actual physical components used to create the actual physical network are modeled, placed and interconnected graphically, visually, and spatially within the site-specific database model in order to represent their actual true physical placements within the actual physical environment. This provides a site-specific model of a network of interconnected components within the database model.

Associated with at least some of the communication network components (sometimes referred to as infrastructure equipment or hardware) within the database model are infrastructure information, which may be in the form of data records, memory data, files, or text entries which contain the infrastructure information that is uniquely associated with every individual component in space within the modeled environment. That is, three different pieces of the same type of equipment within a network that is modeled within a city using this invention would have three distinct sets of infrastructure information records. The infrastructure information records are stored as either a linked list of textual or numeric information to the graphically represented components, or as data structures that are in some manner tagged or linked to the specific components within the database format.

Alternatively, the infrastructure information records may be stored outside of the presently described database format, although this is more cumbersome and requires additional overhead to provide the desired linkage to the actual, unique, site-specific component within the database model. As discussed below, these infrastructure information records provide key interaction between the modeled components that are site-specifically modeled in the asset management system and the actual physical infrastructure equipment that is installed or predicated for use in the actual physical environment. The infrastructure information is shared between: (A) the CAD application which maintains and runs the site-specific model of the network, and which is also capable of running predictions, collecting measurements from remote locations, optimizing and comparing performance, iterating the hardware or modeled hardware to reach desired specified criteria for the network, as well as tracking cost and maintenance records, (B) the actual network (which is working and may provide measured performance data over time to the CAD application or other hardware components, (C) the network components themselves (which may also run programs that connect with or are part of the CAD application as well as store some or all of the data incorporated at the CAD application running the site-specific model of the network, or may simply contain handshaking software and instruction interpretation in order to communicate with the CAD application) and (D) the managers of the network, such as network engineers, technicians, or call centers or alarm stations who use the CAD application (these are the users who need to be able to manage and compare on-going performance and quality of the actual network using the site-specific adaptive control and asset management system described by the current invention). The infrastructure information contained within the records may be modified, edited, altered, and analyzed by a wide variety of methods over time, as described below. The managers may not need to be present to operate the invention, as alarms may be sent through means such as paging/telephone systems to alert humans of a network change of condition or problem. Adaptive control of components in this invention can be used to "repair" network operations, as well.

A computer program permits connection and interaction between the modeled components within the modeled network and the actual components that make up the actual physical network, so that ongoing, periodic, or sporadic communication may occur between hardware components and the CAD application, and so that on-going measured data may be retained and processed by the invention. Additionally, the CAD computer program will allow the components comprising the physical network to be remotely controlled.

For example, an engineer can remotely adjust the channels used by an access point, or the power supplied to a base station antenna in the network in response to an alarm sent by the base station or a remote receiver. Alternatively, the invention may autonomously determine equipment settings as needed. Alarm conditions for all operating parameters that may be simulated or measured may be set in software, via a mouse, or keypad, touchpad, or text line editor, using well known methods for setting fields and data entry in software applications. When alarm settings are established in the CAD application, and when measured data causes an alarm to be set, the invention causes certain predefined actions to occur (such as page the IT staff, call a cell phone, send an email alert, or shut down or reduce power or data rates in the network, etc.) Alternatively, the program, itself, may automatically cause such changes based on preprogrammed responses, and may take action to try and cause the alarm condition to disappear, based on its control capabilities. Time out times may provide a limited or preset time for the invention to attempt to self-heal itself when an alarm occurs, before predefined failsafe instructions are implemented.

The infrastructure information for each actual physical component may be represented in a site-specific manner within the environmental model of the physical environment, and such infrastructure information is preferably embedded within the environmental model 182 as described above. The embedding of infrastructure information for actual components may be done either prior to, during, or after the site-specific placement of the modeled components within the database model. The infrastructure information includes but is not limited to graphical objects representing the actual physical locations of infrastructure equipment used in the actual communication system, as well as data describing the physical equipment brand or type, a description of physical equipment location (such as street address, suite or apartment number, owner or tenant, latitude-longitude-elevation information, floor number, basement or subterranean designation, GPS or Snaptrack reading, etc.), equipment settings or configurations, desired or specified performance metrics or performance targets for the equipment whereby such desired or specified data are provided by the user or the prediction system, desired or specified performance metrics or performance targets for the network which the equipment is a part of, whereby such desired or specified data are provided by the user or the prediction system, measured performance metrics or network metrics as reported by the equipment, predicted alarm event statistics or outage rates, actual measured alarm event statistics or outage rates, alarm threshold settings or alarm metrics as reported by the equipment or the user or the prediction system, equipment orientation, equipment specifications and parameters, equipment manufacturer, equipment serial number, equipment cost, equipment installation cost, ongoing actual equipment upkeep costs and records, predicted ongoing equipment upkeep costs, equipment use logs, equipment maintenance history, equipment depreciation and tax records, predicted or measured performance metrics, equipment warranty or licensing information, equipment bar codes and associated data, information regarding methods for communicating with the physical equipment for the purposes of remote monitoring and/or alarming, alarm records, malfunction records, periodic or continuous performance or equipment status data, previous or current physical equipment users or owners, contact information for questions or problems with the equipment, information about the vendors, installers, owners, users, lessors, lessees, and maintainers of the equipment, and electronic equipment identifiers such as radio frequency identifiers (RF Ids or RF Tags), internet protocol (IP) addresses, bar codes, or other graphical, wired, or wireless address or digital signature.

The "equipment" or "component" above refers to any actual physical object or device, which may be mechanical or electrical or arterial in nature, or any architectural or structural element of a distributed network, including but not limited to wiring, piping, ducting, arteries, or other distributed components or infrastructure.

While the present invention considers the site-specific database model, adaptive control capabilities, and asset management of a wired or wireless communication network as a preferred embodiment, it should be clear to one of ordinary skill in the art that any infrastructure equipment of a distributed nature, such as structured cabling, piping, or air conditioning could be controlled in such an adaptive manner. Some preferred methods for embedding the infrastructure information within a site-specific environmental model is detailed in U.S. Pat. No. 6,493,679, entitled "Method and System for Managing a Real Time Bill of Materials," awarded to T. S. Rappaport et al, and pending application Ser. No. 09/764,834, entitled "Method and System for Modeling and Managing Terrain, Buildings, and Infrastructure" filed by T. S. Rappaport and R. R. Skidmore (Docket 02560041aa) which are hereby incorporated by reference.

The resulting combined environmental and infrastructure model, wherein the modeled infrastructure and the associated infrastructure information for each component having been embedded in the environmental model in a site-specific manner, and also embedded in each piece of actual equipment, may then be stored onto any variety of computer media. The combined model is understood to include detailed cost data and maintenance data, as well as specific performance attributes and specific operating parameters of each piece of network hardware, some or all of which may be required for useable predictions and simulations and iterative control of the network. At any point in time, the combined environmental and infrastructure model may be retrieved from the computer media, displayed or processed in a site-specific manner with actual locations of components and component interconnections shown within the environment on a computer monitor, printer, or other computer output device, and/or edited using a computer mouse, keyboard or other computer input device known now or in the future. Furthermore, the combined model may also be embedded in software, or implemented in one or more integrated circuits, for real time or near real-time implementation in a hardware device, portable computer, wireless access point, or other remotely located device.

The editing above may involve changing any of the infrastructure or environmental information contained in the model, including any equipment or operating parameters of particular pieces of hardware that may be altered by the control of the computer CAD application of this invention. Such changes may happen whether the combined model is implemented in chip, embedded software, or standalone form.

Furthermore, the combined environmental and infrastructure models stored on computer media may contain models of infrastructure equipment that are capable of communicating and exchanging data with the CAD computing platform in real-time. The actual hardware represented by such models are understood to be able to provide such communications, and the invention exploits this capability. This enables the invention to measure, predict, display, aggregate, iteratively operate upon, and store measured equipment performance, where performance data includes but is not limited to sensible performance metrics such as frequency utilization (such as a spatial-temporal record of occupied channels, unused channels, and lists of channels associated with different transmitters, lists of available, unavailable, used and unused channels, over time and/or space, where channel lists and channelization methods or strategies may be monitored, established, or adjusted remotely by the present invention), capacity utilization (such as data throughput performance, noise levels, performance data for particular classes of users or subclasses of a particular class of users, the amount of blocked or delayed calls or packets, holding times or dropped traffic data, instantaneous or time averaged data transport, and other metrics that denote the amount of capacity provided over a specific spatial environment, some of which may be adjusted, monitored or established by the present invention) received signal strength (RSSI), signal-to-interference ratio (SIR), signal-to-noise ratio (SNR), bit error rate (BER), loading, capacity, frame error rate (FER), frame resolution per second, traffic, packet error rate, packet latency, packet jitter, interference levels, power levels, quality of service (QoS) for one or more users, data throughput, outage statistics, failure rates, as well as sensory data such as temperature, pressure, flow rate, environmental conditions, power consumption and fluctuation, production levels, storage levels, cycle time, or other performance metrics or statistics known now or in the future. Further, using the infrastructure information records, this enables the invention to remotely access equipment for the purposes of remote monitoring, malfunction detection and/or alarm generation, or other forms of messaging known now or in the future. For example, the invention may store desired network operating performance parameters that are communicated to certain pieces of actual equipment, and if the equipment ever measures the network performance and finds the performance parameters out of range, an alarm is triggered and reported to the invention for display, storage, processing, and possible remote retuning of pieces of equipment by the invention to readjust the network to move performance back into the desired range.

Communication between the physical equipment and the combined environmental and infrastructure model running on the CAD application at a computer may occur via the Internet, via standard communication protocols such as SNMP and TCP/IP, wireless or wired telephone networks, passive or active wireless RF tags, bar code scanning, or any other wired or wireless communication system known now or in the future. This communication could be unidirectional, where information is only being sent from the environmental model to the physical equipment, or vice versa, or the communication could be bidirectional, where information is being sent back and forth between the CAD application and the physical equipment.

A communication link between the CAD application running the site-specific environmental and infrastructure model and the physical equipment represented in the environmental and infrastructure model could be established or initiated by either side of the link, and may be established on a continuous, periodic, or intermittent basis, so that information may be exchanged. This control and data exchange may take the form of commands or instructions for the equipment to perform certain actions or for the database to receive or request certain results. For example, as described above, an engineer can remotely control, in manual fashion, the physical equipment making up the network by interacting with the CAD application running the site-specific environmental model, or the CAD application may automatically (or under user-control) cause the physical equipment to adjust operating configurations in a prescribed or desired or optimal or preferred manner. The control and data exchange may also include the results of those control actions (feedback provided between the CAD application and the equipment) and may also provide new or previous equipment performance and configuration parameters, updated maintenance or equipment use information, inspection logs, cost or price information, physical positioning information, time, malfunction or hazard alerts, emergency information, new or updated instruction sets, updated or new equipment information, or any other form of communication that may be supported by, generated by, recorded by, or reported by the equipment to the CAD application, or by the CAD application to the equipment.

Information received from physical equipment via the communication link is then embedded or linked within the site-specific environmental and infrastructure model at the CAD application, and may be displayed, aggregated, processed, analyzed, iterated and compared to simulations, and/or stored. The communications between the CAD application running the site-specific environmental and infrastructure model and the physical equipment may be manually initiated by a user of the invention, or automatically or periodically initiated by either by a system incorporating the invention or the physical equipment, say at a particular time of day or every 15 minutes, or automatically initiated by the physical equipment in response to some pre-determined or experienced or measured event.

For example, a particular piece of equipment may have the ability to be instructed to or may automatically or periodically perform a diagnostic routine on itself and report the results. In the present invention, if that piece of equipment has been site-specifically modeled and embedded within an environmental model as described above, the results of the diagnostic routine for the equipment can be received from the equipment and embedded into the CAD application running the environmental model for that piece of equipment. The updated environmental and infrastructure models may then be stored with the new information embedded in the model. Similarly, the physical equipment may be capable of monitoring performance metrics such as quality of service (QoS), throughput, or other important performance metrics of the network it is a part of, and such data may be communicated to, received by, stored, displayed, and processed by the invention.

Accessing and utilizing this communication link between the site-specific model of the communication network and the physical equipment can be performed by a variety of means, one of which is detailed in pending application Ser. No. 09/954,273, which is herein incorporated by reference.

The placement of infrastructure equipment may include cables, routers, antennas, switches, access points, and the like, or which would be required for a distributed network of components in a physical system. Important information associated with some or all pieces of infrastructure equipment that are modeled by and maintained within the invention using the described database format includes physical location (placement of the equipment within the database so as to site-specifically represent its actual physical placement) as well as data such as equipment vendors, part numbers, installation and maintenance information and history, system or equipment performance and alarm data and history, as well as cost and depreciation information of the specific components and subsystems.

Figure 3:
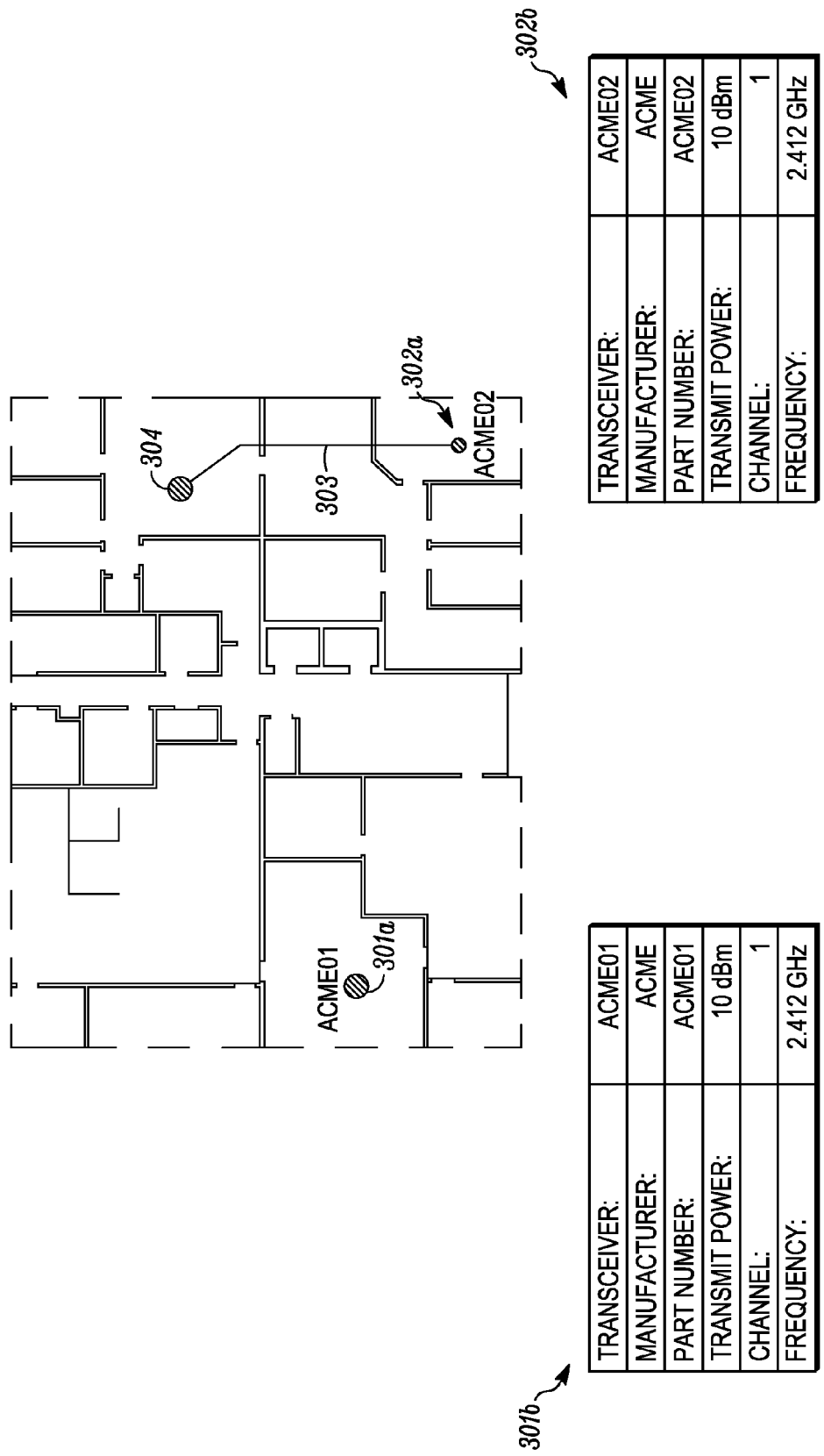
FIG. 3 is a top-down view of a building floor plan containing transceivers and other communications network infrastructure.

Referring to FIG. 3, there is shown the same site-specific environment as shown in FIG. 2. Using the preferred embodiment of the invention, an example communications network has been defined in FIG. 3. A transceiver 301*a* has been positioned within the site-specific environment and configured 301*b*. The configuration information 301*b* includes the manufacturer ("Acme"), part number ("Acme01"), transmit power ("10.0 dBm"), channel setting ("1"), and corresponding frequency ("2.412 GHz"). A similar transceiver 302*a* has also been positioned within the site-specific environment and configured 302*b*. The second transceiver configuration information 302*b* includes the manufacturer ("Acme"), part number ("Acme02"), transmit power ("10.0 dBm"), channel setting ("1"), and corresponding frequency ("2.412 GHz"). In addition, the second transceiver 302*a* has a coaxial cable 303 attached onto it. The coaxial cable 303 has been positioned within the facility and is itself connected to an antenna 304.

Referring to FIG. 1, once a communications network has been represented within the site-specific model of the environment, the invention allows for the selection of potential substitute equipment and potential alternate configurations for each network component 103. That is, the user of the present invention may select from a pick list of defined equipment types and configurations a finite number of alternate configurations for each transceiver or communications network component within the site-specific model, or the invention may automatically sense the equipment which is connected to the CAD application, and then not allow a change of the equipment in simulation if the network is running real time, or cause the user to select an "off-line" mode where simulations may be run but not used to control the network hardware for desired performance criteria.

The selection of alternate equipment and their locations is allowed if the CAD application is not in control mode, that is, when it is not in communication with and control of actual network hardware. In this mode, the invention serves as a design system with smart algorithms that allows a user to simply set up particular performance criteria, and then the CAD application iteratively explores a very large number of possible configurations, locations, settings, cost criteria, etc. to determine a best or group of best designs. A designer or maintenance technician may manually select equipment from the same or different manufacturers or ask the CAD application to automatically select equipment from one or more manufacturers, different models of equipment from the same manufacturer, different power output settings, different power input settings, different configurations of channel or frequency settings, different antenna locations, pointing directions, phasing, gain patterns or orientations, different equipment locations, different costs QoS or coverage or capacity performance goals within the environment, or any device-specific configuration setting or information that could impact network performance or cost, or any combination of the above.

Referring to FIG. 4, there is shown a sample selection window for alternate equipment as exists in the preferred embodiment of the invention. A table containing a list of desirable equipment is displayed to the designer or maintenance technician. The table shown in FIG. 4 organizes the equipment by Type, Manufacturer, Part Number, Description, Loss (a performance metric), Number of Connections, and Physical Cost. One skilled in the art could see how any number of additional criteria could be used to organize the equipment shown in the table, including but not limited to weight, physical dimensions, color, form factor, shape, material of construction, power supply, availability, or any other criteria. Using a mouse or other computer pointing/selection device, the user may select entries from the table 401 representing equipment that is to be considered for placement within the network. Entries in the table that are not selected 402 will not be considered for placement within the network. Equipment that has been selected 401 will be analyzed during the iterative loop 106-112 shown in FIG. 1.

The listing of desirable equipment shown in FIG. 4 may be constructed through several means, such as including but not limited to importing from external equipment databases, downloading from off the web, creation in text or file editors, or retrieved from Wireless Valley's SitePlanner or PartsPlanner products. The listing may display all or some subset of equipment contained within a computerized database of equipment. The computerized database of equipment contains detailed information on each piece of equipment in a manner suitable for display in a table similar to that shown in FIG. 4. The computerized database of equipment may be located anywhere on the Internet or local computer network, and may be edited or customized by the designer, maintenance technician, or anyone with authority to access and alter the database contents.

In the preferred embodiment of the invention, the designer or maintenance technician may choose to display all equipment contained within the database of equipment or simply a subset of equipment. The selection criteria for displaying equipment subsets is determined by the designer or maintenance technician, and may be based upon any information stored within the equipment database regarding each piece of equipment. For example, the user may choose to only display equipment below a certain cost threshold or within a certain range of performance or physical dimensions, or with suitability to the particular desired application. This enables the designer or maintenance technician to limit the number of entries that appears in the selection window shown in FIG. 4.

In addition, the user may choose to allow the invention to automatically determine appropriate equipment types, such as from preferred vendors or based on good past experience, for display in the selection window of FIG. 4. If so, the invention will analyze the current equipment utilized in the network (refer to FIG. 3) and use the information regarding the equipment currently used to automatically create a selection criteria used to determine the appropriate equipment to display in the selection window of FIG. 4. For example, the network shown in FIG. 3 consists of two types of wireless LAN access points 301, 302, a coaxial cable 303, and an antenna 304. The invention may analyze the network shown in FIG. 3 and determine that the appropriate equipment to display in a selection window are wireless LAN access points, coaxial cables, and antennas; other types of equipment (e.g., fiber optic cables, amplifiers, etc.) may be excluded. The automatic subset of equipment selected by the invention for display in FIG. 4 may then be further limited based on user input. For example, only wireless LAN access points that fall within a certain price range or by a certain vendor or with a particular form factor may be shown, or only antennas that are immediately available within existing stock may be shown.

An alternate method for the automatic selection of equipment types for display in the selection window of FIG. 4 involves the use of a relational database of equipment. Through using a relational database, associations between different or similar types of equipment can be established. For example, particular types of wireless LAN access points may be identified as being compatible with particular types of antennas. This enables the invention to more intelligently select the equipment to display to the user for selection in FIG. 4. If the network shown in FIG. 3 contains a specific type of wireless LAN access point 302 and a specific type of coaxial cable 303, and the user only desires to replace or identify an alternate for the coaxial cable 303, the invention can search the relational database to identify all types of coaxial cables that are compatible with the existing wireless LAN access point 302. The resulting subset of coaxial cables can then be further filtered by user criteria, such as cost, performance, and availability.

Note that although the invention has been described as utilizing an existing database of equipment types, one skilled in the art could easily see how the described database could be generated in real-time through interaction with equipment manufacturer websites or electronic catalogs via the Internet or other communication medium. Thus, instead of searching a computer database of equipment types, the invention could search various vendor websites or electronic catalogs for suitable equipment. Similarly, it is clear that many aspects of the disclosed invention, itself, could be implemented on the world wide web.

The designer or maintenance technician may choose to identify different configurations or settings for each piece of equipment selected in FIG. 4. In the preferred embodiment of the invention, a selection window of configuration settings for each piece of equipment is shown, and the user then may choose which particular configurations or settings he or she considers desirable. Referring to FIG. 5, there is shown a sample selection window for alternate equipment configurations or settings. In FIG. 5, there is shown a selected piece of equipment (a Cellular Specialties Amplifier part number CSI-BDA110) 501. There are three possible configuration settings for the selected amplifier, where each configuration setting results in a different Loss (a performance metric) for the amplifier 502. Thus, the selected amplifier may be configured for a performance of −40 dB, −30 dB, or −20 dB. Using a mouse or other computer pointing/selection device, the user may select any or all of the displayed equipment configurations. The selected possible equipment configurations will be iterated by the invention in steps 106-112 as shown in FIG. 1.

Figure 6:
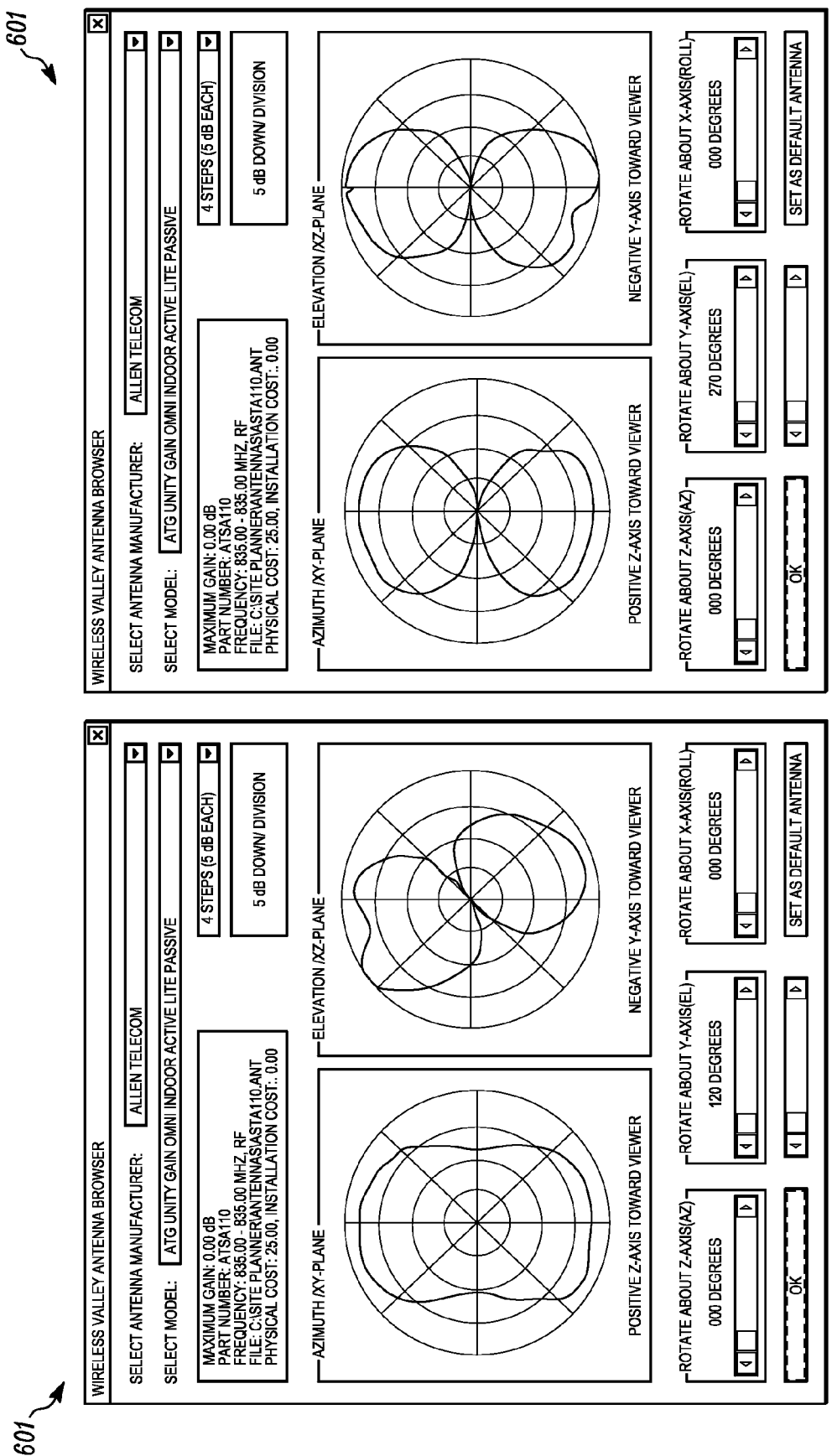
FIG. 6 is another examples pick list of equipment configurations.

Referring to FIGS. 6a and 6b, there is shown another sample selection window for alternate equipment configurations or settings. In the case of antenna or radiating elements, the orientation of the piece of equipment itself is a configuration setting. In this case, the present invention displays the various orientations as selectable configuration settings. In FIGS. 6a and 6b, for example, two different orientations 601 of the same antenna are selected by the user, the first is the antenna rotated 120 degrees in elevation while the other is the antenna rotated 270 degrees in elevation.

Rather than the user being required to select desirable equipment configurations, the invention may automatically select desirable equipment configurations. This can occur through use of a relational database, wherein certain configurations of equipment are desirable given the existing configurations or settings of other equipment in the network. For example, referring to FIG. 3, if the existing antenna 304 is mounted upside down on the ceiling, the invention may choose to automatically limit all possible alternate antennas selected to have the same orientation. The iterative loop 106-112 in FIG. 1 also provides for the automatic determination of desirable equipment positions. The invention provides the means for the identification of a finite number of desirable equipment positions within the 2-D or 3-D modeled environment for use in the iterative loop. There are several possible methods for identifying these finite number of desirable equipment positions.

Figure 7:
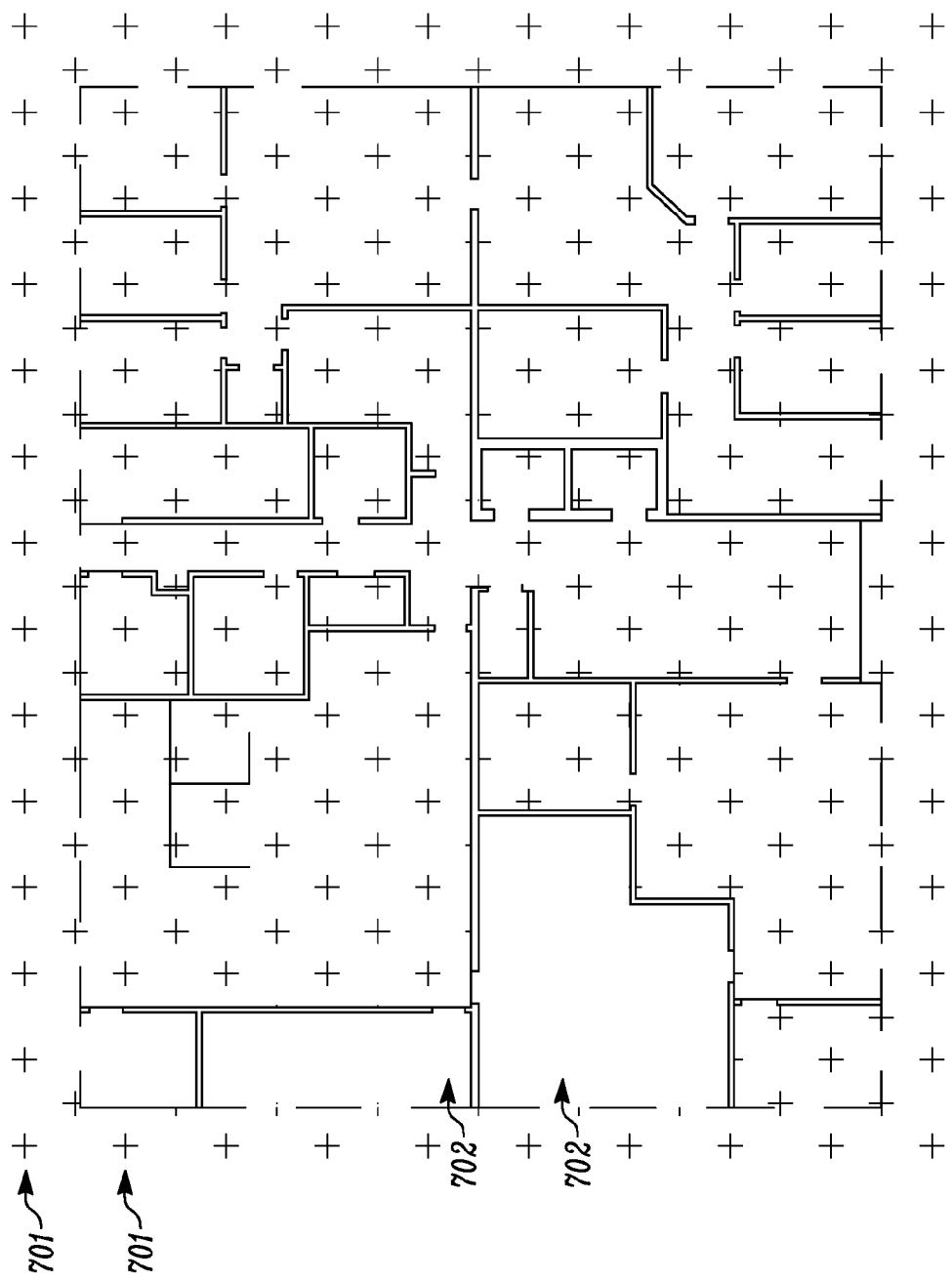
FIG. 7 is a floor plan overlaid with a regular grid of possible (or existing) equipment positions.

Referring to FIG. 7, the invention overlays the 2-D or 3-D modeled environment with a regularly spaced grid of points 701. These points 701 are evenly spaced in either a 2-D plane or 3-D matrix at intervals specified by the user. The points may then be used in the iterative loop as possible locations to position equipment within the modeled environment. There may exist locations within the environment where equipment is either not desirable or it is just not feasible to position equipment. For example, it may not be possible or desirable to position equipment within a hospital x-ray room or within another tenant's office space. The present invention allows the user to identify such non-desirable locations and thus eliminate positions within those areas as considerations for equipment placement. Using a mouse or other computer pointing/selection device, the user may select areas or regions within the modeled environment to exclude from consideration of equipment placement. Referring to FIG. 7, several rooms 702 within the modeled environment have been identified as areas to exclude from consideration for equipment placement. Using the same approach as described above, it is clear that for an already-installed network, FIG. 7 may represent where equipment is already located, and where equipment has already been verified to not be located, etc.

Figure 8A:
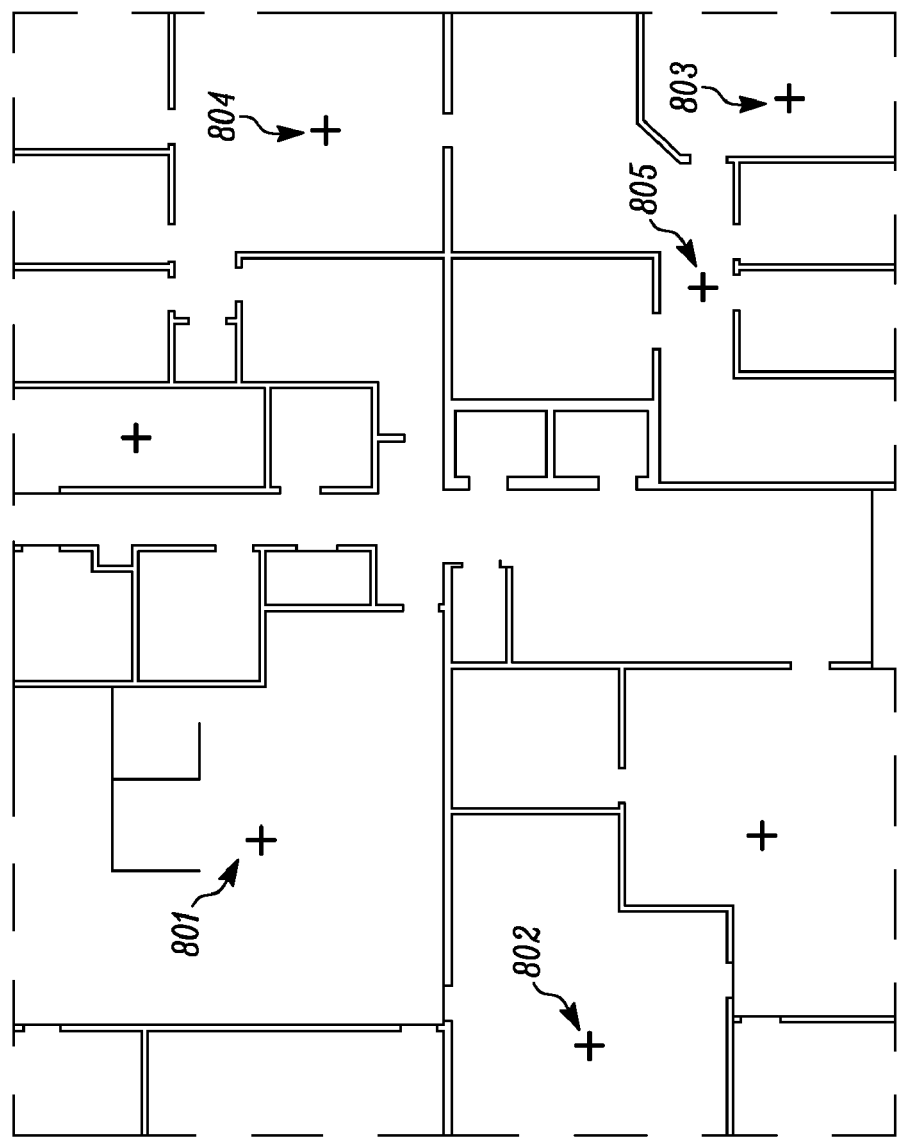
FIG. 8 shows a set of possible (or existing) selected equipment positions.

Rather than overlay the modeled environment with an evenly spaced grid of possible positions, the invention alternately allows the user to identify likely or possible locations for equipment positions. Using a mouse or other computer pointing/selection device, the designer or maintenance technician may identify positions within the 2-D or 3-D modeled environment as potential equipment positions. Referring to FIG. 8a, the user has identified several positions 801-805 where equipment may be placed. Note that such identified positions may imply or exclude certain equipment configurations. For example, if the selected position 801 is on the ceiling, such a position may further limit the type or configuration of equipment that is to be positioned at that location. The invention may utilize such information to more intelligently make equipment type, configuration, and position decisions.

Figure 8B:
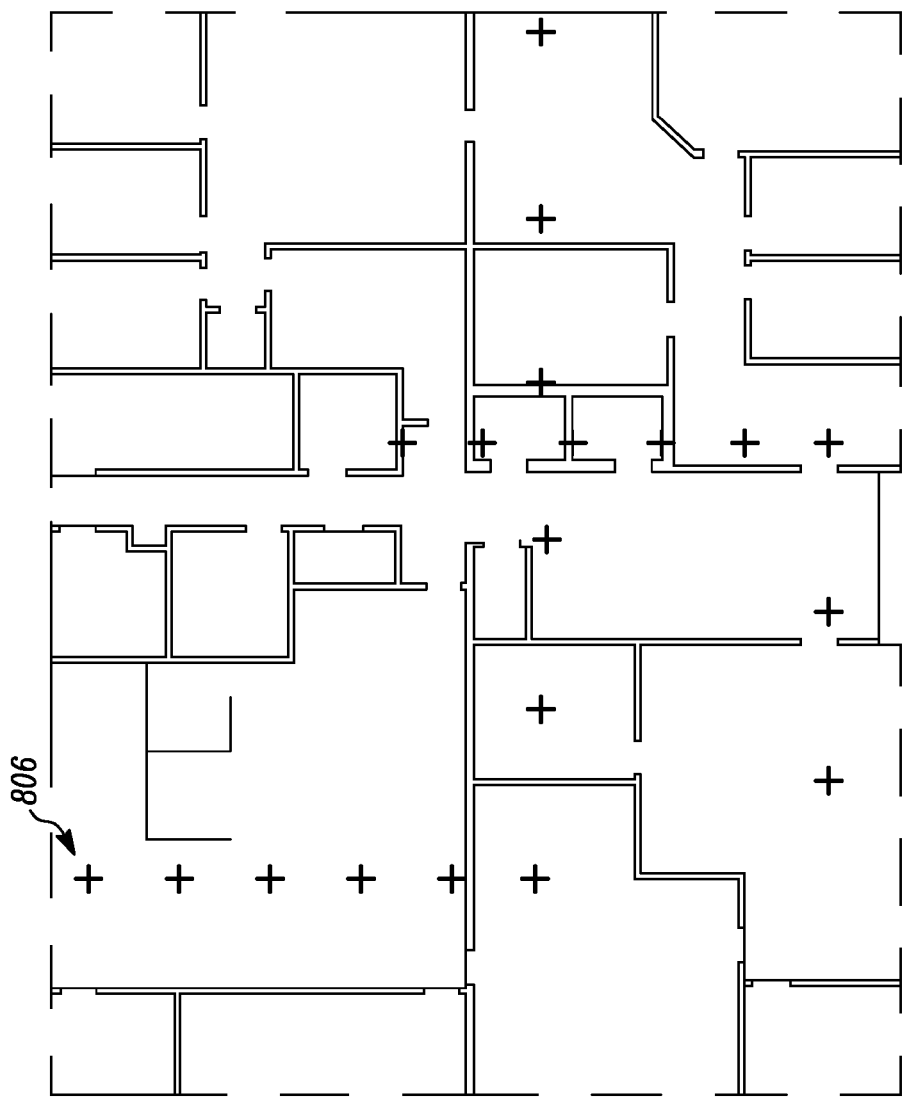

Note that modern architectural CAD systems provide the means for architects and structured cabling designers to specify to a high degree of detail the location and availability of electrical wiring or other communication infrastructure. For example, a CAD drawing of a facility may include detailed wiring diagrams providing the accessibility of electrical outlets, or detailed Ethernet wiring diagrams providing the accessibility of the existing wired network infrastructure. The present invention can utilize this information, if the information is available, to generate a set of possible equipment positions based upon the availability of power and/or communications infrastructure. Referring to FIG. 8b, the invention has utilized knowledge of the facility's Ethernet wiring to generate a set of possible positions 806 at which wireless LAN access points could most easily be positioned. If detailed CAD drawings containing such information are not available, the invention can rely upon alternate sources such as color coded raster images (i.e., where electrical and/or Ethernet infrastructure is identified by colored or dashed lines). One skilled in the art could easily see how this automatic position identification process could be extended to any other selection criteria, including availability of HVAC, water piping, sewage piping, ventilation ducts, cable trays, drop ceilings or raised floors, fiber optic infrastructure, telephony infrastructure, or any other criteria known now or in the future. Note that for FIG. 8, if performance measurements were readily available for an already installed network, the invention could process measurements in order to similarly determine how to more intelligently select equipment type, configuration, settings, and positions. Autonomous network control could also be provided. For example, channels could be re-tuned, antenna patterns readjusted, and power levels reset "on-the fly" through control of hardware equipment by the CAD control/GUI portion of the invention, in order to achieve a particular desired metric or metrics, or to improve the overall quality or allocation of bandwidth, quality of service, etc. to the users on the network.

Referring back to the design case, note that any of the steps of selecting alternate equipment types, configurations or settings, or positions may be skipped at the user's option. For example, the user may choose to skip the step of selecting equipment positions and instead choose to only iterate equipment types and configurations.

The set of selected alternate equipments and/or alternate equipment configurations and parameter settings and/or alternate equipment positions is iterated across specific discrete values (set either automatically by the CAD application, as specified by the user, or provided for by the equipment or its specification) during the automated processing loop 106-112 in order to determine what combination of equipment types and/or configurations or locations or orientations produces the most desirable overall network performance.

Once a set of defined transceiver or other equipment types and/or configurations have been defined 103, the current performance of the communications network is predicted 104. Note that the predictions may be developed through no measurements (e.g. "blind" predictions), or may be derived from models that use measurement data that has been collected by a measurement tool or sensor or made available through some other means. The invention allows the visualization and recording of simulated or predicted or measured performance of telecommunication systems that would be designed, or which have already been designed for, operation within an actual physical 3-D environment that is modeled using the techniques taught herein, and furthermore supports the ability to compare predicted versus actual network or system performance, as well as the placement, display and storage of infrastructure equipment such as telecommunication system components and cables used to create a wireless or wired network. Embodiments of such prediction, visualization, measured and comparison capabilities that may be used in the invention, for example, are taught in U.S. Pat. No. 6,317,599, U.S. Pat. No. 6,442,507, and U.S. Pat. No. 6,499,006, and co-pending application Ser. No. 09/668,145, entitled "System and Method for Design, Tracking, Measurement, Prediction and Optimization of Data Communication Networks," filed by T. S. Rappaport, R. R. Skidmore, and Ben Henty (Docket 2560038aa), each of which are hereby incorporated by reference. Predicted performance metrics may include but are not limited to: adequate connectivity, radio signal strength intensity, network throughput, bit error rate, frame error rate, signal-to-interference ratio, signal-to-noise ratio, frame resolution per second, traffic, capacity, signal strength, throughput, error rates, packet latency, packet jitter, symbol jitter, quality of service, security, coverage area, bandwidth, server identification parameters, transmitter identification parameters, best server locations, transmitter location parameters, billing information, network performance parameters, C/I, C/N, body loss, height above floor, height above ground, noise figure, secure coverage locations, propagation loss factors, angle of arrival, multipath components, multipath parameters, antenna gains, noise level reflectivity, surface roughness, path loss models, attenuation factors, throughput performance metrics, packet error rate, round trip time, dropped packet rate, queuing delay, signal level, interference level, quality of service, bandwidth delay product, handoff delay time, signal loss, data loss, number of users serviced, user density, locations of adequate coverage, handoff locations, locations of adequate throughput, $E_cI_o$, system performance parameters, equipment price, maintenance and cost information, user class or subclass, user type, position location, and other commonly used communication network performance metrics as mentioned elsewhere herein, all in either absolute or relative terms.

Figure 9:
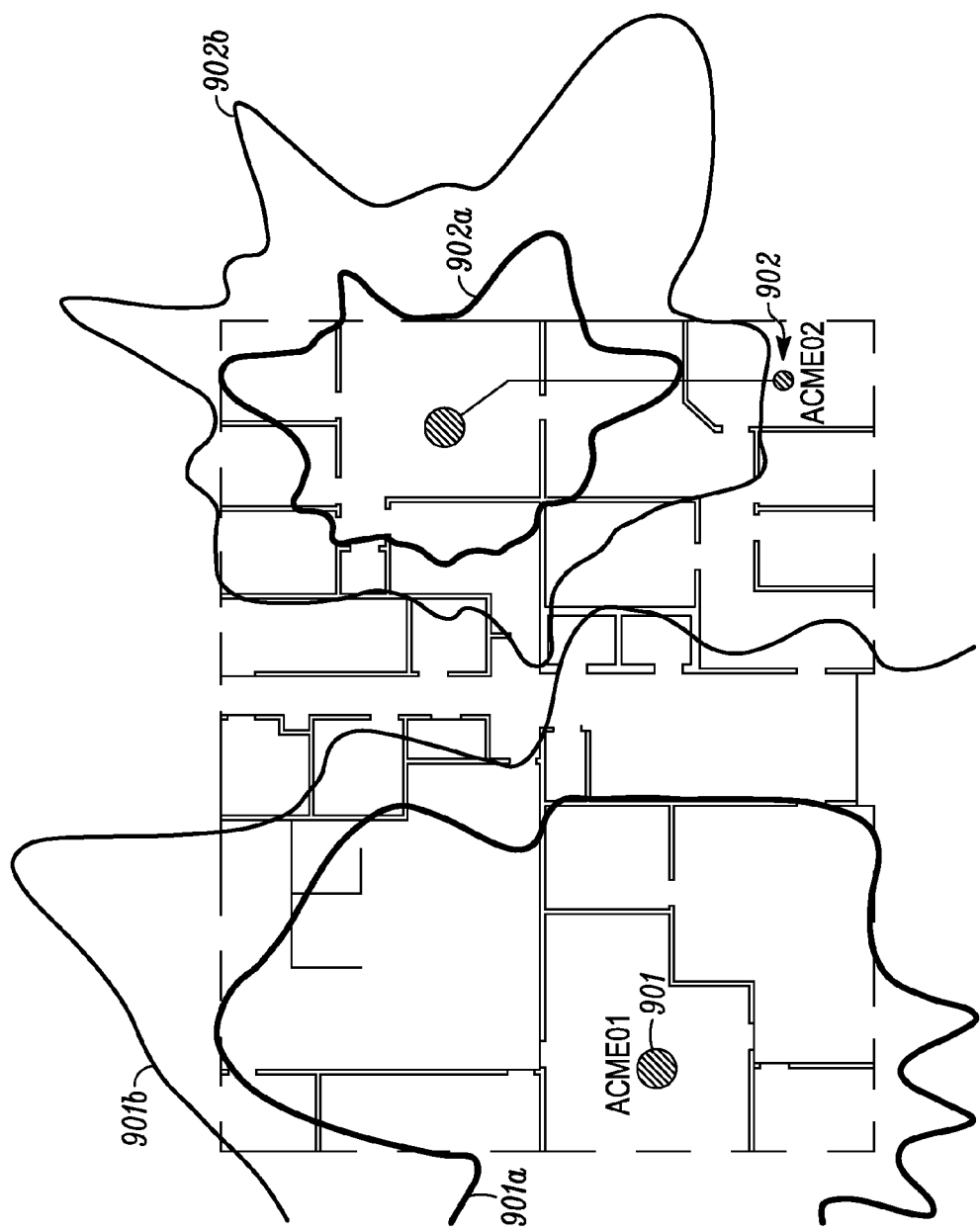
FIG. 9 is a top-down view of a building floor plan containing predicted (or measured) coverage contours.

Referring to FIG. 9, there is shown the predicted coverage of the communication network that was defined in FIG. 3. In FIG. 9, the "Acme01" transceiver 901 has predicted coverage boundaries shown for −60 dBm 901a and −70 dBm 901b respectively. Similarly, the "Acme02" transceiver 902 has predicted coverage boundaries shown for −60 dBm 902a and −70 dBm 902b respectively. Note that the coverage boundaries do not overlap one another, resulting in potential areas without coverage within the building. These boundaries could also be throughput, bit error rate, etc., and other and other metrics known now or in the future. Note that in addition to predicted performance, the same approach may apply to measured performance metrics collected by measurement devices or reported to the CAD control/GUI software. That is, FIG. 9 could also be constructed from measurements supplied by the invention, or measured data provided by other means, for example, through walk test data or from data supplied by a switch or other means (e.g., collected data would be input into the database model and used to analyze operations of the communications network or the measured data may be used in in prediction calculations, in addition comparisons of predicted to measured data may be performed and comparisons of measured data from measurements made at different times may be analyzed).

Figure 10:
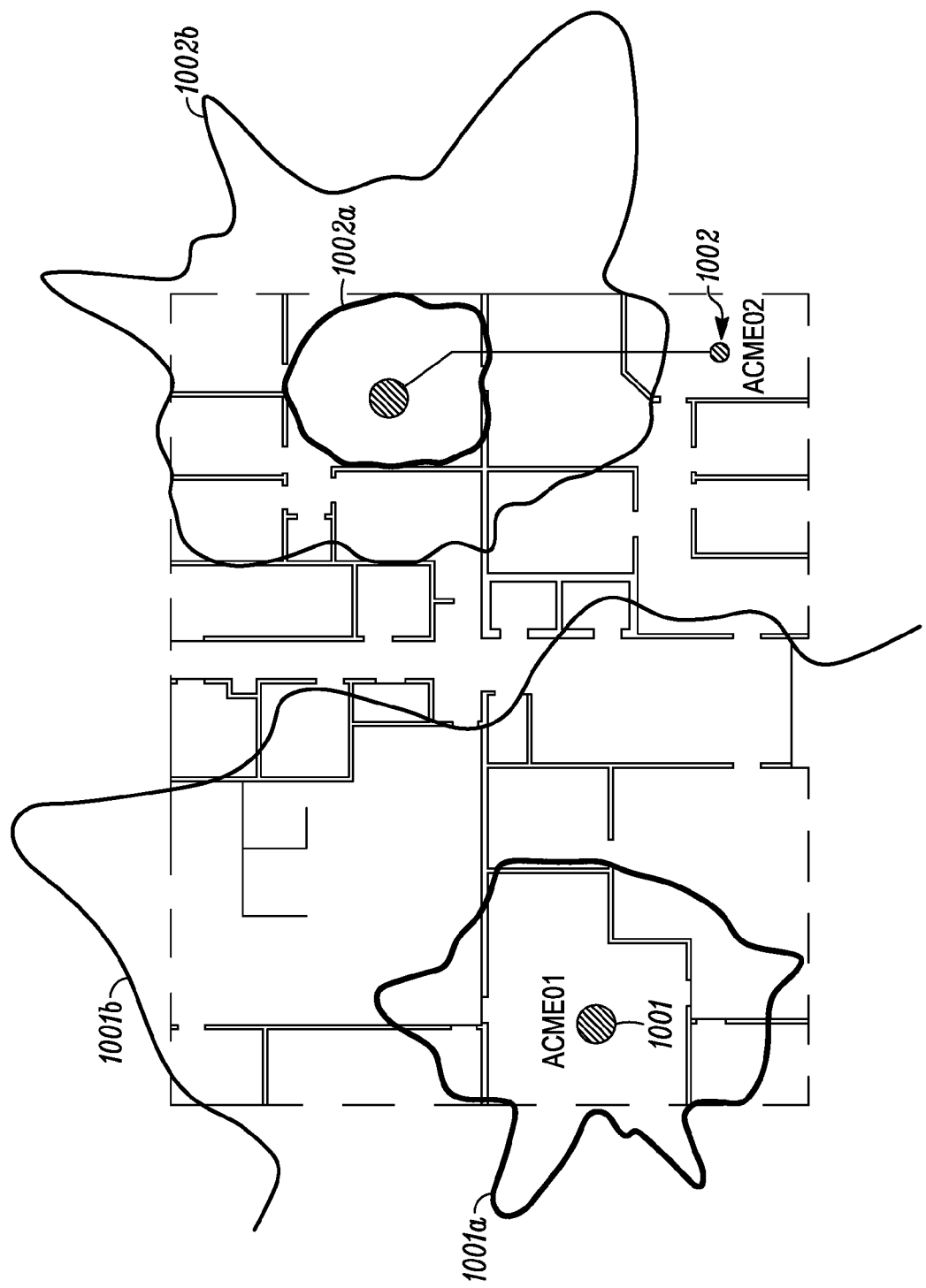
FIG. 10 shows a top-down view of a building floor plan containing predicted (or measured) interference contours.

Referring to FIG. 10, there is shown the predicted interference for the communication network defined in FIG. 3. As noted in FIG. 3, both transceivers "Acme01" 301a and "Acme02" 302a are configured to have the same channel ("1") and frequency ("2.412 GHz"). Thus, they directly interfere with one another. This is shown in FIG. 10, where the transceiver "Acme01" 1001 has predicted interference boundaries shown for 30 dB signal-to-interference (SIR) 1001a and 10 dB SIR 1001b respectively. Similarly, transceiver "Acem02" 1002 has predicted interference boundaries shown for 30 dB SIR 1002a and 10 dB SIR 1002b respectively. Note that the interference contours project away from one another, confirming the fact that the two transceivers are interfering with one another. It is clear that such interference shown in FIG. 10 could also be measured. For example, FIG. 10 could display measured interference results from an actual installation, where a new tenant in a shared office space deploys her own Wireless LAN network without knowledge or concern for the other (existing) transceiver within the physical environment.

In order to accurately capture the performance of the network as a whole, the present invention provides for predicting the performance of the network throughout the entire simulated environment, and then further allows feedback to the simulated design containing models of hardware components to achieve a desired or improved result. The simulation needed to first achieve the predicted performance of the site-specifically modeled network is carried out by the invention by discretizing in either an automatic or user-selected pattern the modeled site-specific environment into a grid of points. Also, the invention, when supplied measurements and connected in real time to actual network hardware, is able to use the measured data throughout the environment, as seen from particular devices on the network or as provided by some other means, in order to reconfigure the network equipment in actual operation.

Figure 11:
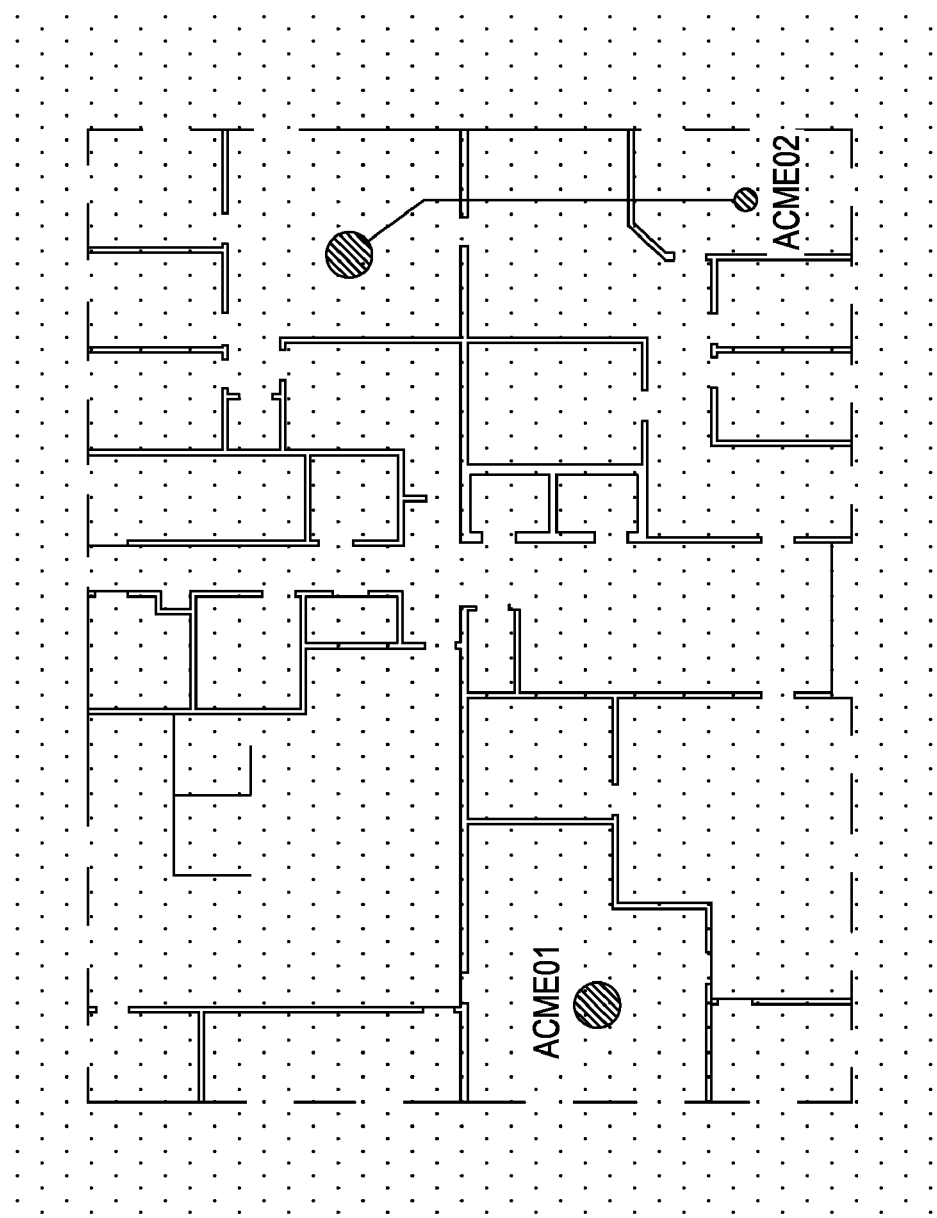
FIG. 11 shows a top-down view of a building floor plan overlaid with a selected grid of positions at which to predict (or measure) network performance.

The predicted performance of the network at each point is calculated and stored by the present invention. FIG. 11 provides an example of a visible overlay of the site-specific computer database with a grid of points 1101 from the top down perspective. The performance of the network is then calculated on the bases of the average network performance across all points within the environment. Individual or selected sets of points and locations within the three-dimensional grid may be weighted as higher or lower priority areas than others. For example, a hospital emergency room or conference room may be deemed higher priority areas for improved network performance than the bathrooms or stairwells. It is clear that FIG. 11 could also be derived from measured data.

Referring to FIG. 1, once the current performance of the network has been determined 104, the processing loop (iterative processing) of the invention begins 105. At the start of the processing loop, the user selects one or more performance criteria that are desirable to improve. For example, the user may select to improve the coverage area of the network or reduce the overall interference of the network, or provide better service to particular types of users who are specified within the CAD model, or a combination of many such goals. The user may also specify priorities on particular portions of the coverage area, where service is a premium for all users, regardless of the class of user. Available performance criteria considered by the present invention includes but is not limited to adequate connectivity, RF coverage, data throughput, quality of service (QoS), packet error rate, packet throughput, packet latency, bit error rate, signal-to-noise ratio (SNR), carrier-to-noise ratio (CNR), signal strength or RSSI, rms delay spread, distortion, equipment cost, equipment reliability, installation cost, equipment warranty periods, or any other criteria known now or in the future that directly or indirectly effects the decision-making process in designing, deploying, maintaining, troubleshooting, or upgrading a network of equipment. The selection and desirability of each performance criteria is selected by the user through computer dialog interfaces defined in the present invention, or from table look ups, embedded settings, preset or default values, or other standard means. More than one performance criteria may be selected, but each is ranked by the user according to importance.

Once one or more performance criteria have been selected as goals to improve within the network 105, the present invention begins the iterative, user-specified, or automatic analysis process. The analysis process may be automated, may time out automatically, or may allow the user to intervene or set initial conditions, in order to help avoid and deal with convergence issues or to deal with the cases when particular goals are met satisfactorily without further computation being required.

Recommender systems may also be used as part of the analysis process. The present invention loops through the various settings of each selected transceiver or communications network component 106, and through each possible pre-specified location for each particular component (not shown). For each transceiver (or other hardware component or equipment), the present invention sequentially or intelligently selects each possible alternate or substitute transceiver or network component 107 (as identified in step 103), and for each device, may also step through each of the available channels, channel lists, power settings, thresholds, number of users, etc. For each alternate or substitute device, the present invention loops through each possible defined configuration for the device 108 (as identified in step 103). Each transceiver in turn is then replaced by each possible combination of hardware device and configuration setting 109. The overall performance of the network is predicted once more 110, and the result is compared with the previous predicted performance result on the basis of the performance criteria selected by the user (as identified in step 105). If the performance of the overall network given the revised types and/or configurations of the transceiver is better than the predicted performance for prior iterations, the type and configurations of all transceivers is stored 111. Note that one or many "acceptable" configurations and types may be stored and a number of well known methods are available to collect, store, and sort the best results. It can be seen that antennas and their locations and orientations could also be iterated through.

The iterative process continues until all possible combinations of types and configurations and settings and orientations and locations for each network component under consideration have been analyzed. Thus, when the iteration has concluded 112, the ideal type and configuration for each component in the network has been identified that provides the most dramatic improvement in the performance criteria.

Through this mechanism, the present invention determines one or more optimal or preferred types and configurations of components in the modeled communication network that provides the most desirable overall network performance. The results are displayed graphically to the end user for post-processing and analysis 113. Despite the large number of possibilities of configurations and iterative steps, the computations are extremely fast, on the order of a few seconds, on today's modern computers with 2 GHz clock speeds, and these speeds may be increased further with smart algorithms such as generic algorithms, recommender systems, or tree searches, and with faster computing equipment and deeper memories which are evolving.

For the case when the invention provides control of actual operating networks, certain features are not allowed to be adjusted during iterative analysis—for example, since the operating network is already installed, the re-orientation or re-location of components is not allowed, and only the existing hardware components that can be remotely adjusted by the CAD application are modeled in the iterative processing (settings such as frequencies, bandwidths, antenna patterns that may be electrically steered, power levels, etc.). Nevertheless, there is still a great deal of improvement that can be gained by adjusting configurations or adjustments on existing equipment, and the improved performance, obtained through iterative simulation, can be implemented through control to the actual hardware. For example, emerging network equipment will include MIMO (multiple-input multiple output) antennas, modems, or ultrawideband devices, or sensors which provide network operators with unprecedented flexibility between applications, bandwidth and power tradeoffs in an actual network The current invention could provide real-time or near real-time control for such future equipment in a communication network using the described techniques.

Figure 12:
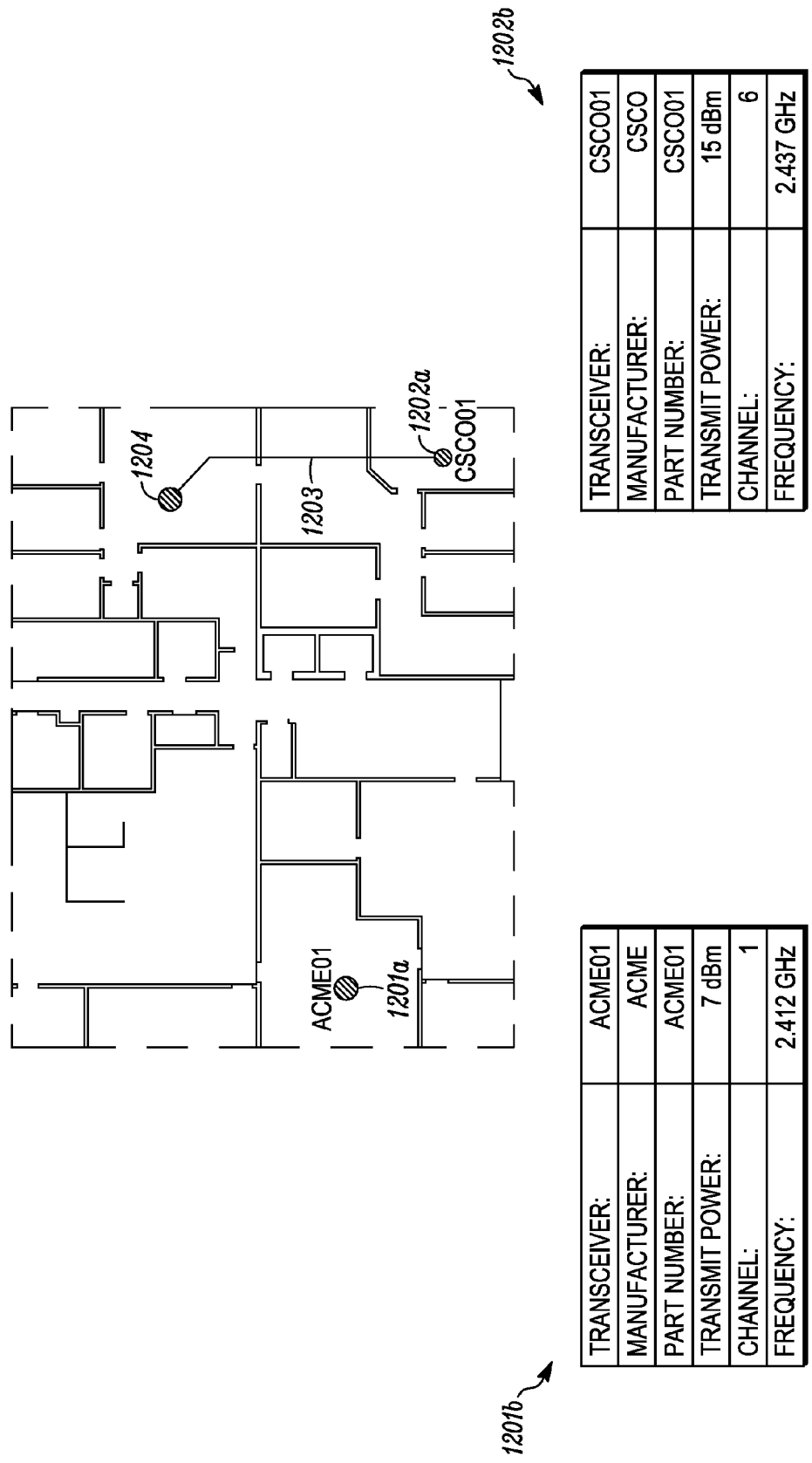
FIG. 12 shows a top-down view of a building floor plan containing new types of network hardware or equipment.

Referring to FIG. 12, the results of having the communications network presented in FIG. 3 processed by the present invention is displayed. The original "Acme01" transceiver 1201a has had it's transmit power altered from "10 dBm" to "7 dBm" 1201b. More dramatically, the original "Acme02" transceiver from FIG. 3 has been replaced with a new transceiver from a different manufacturer—"Csco" 1202a. The new "Csco01" transceiver 1202a has been configured with a transmit power of "15 dBm" 1202b, and set to send and receive on channel "6" 1202b, which corresponds to a frequency of "2.437 GHz" 1202b. It is clear that FIG. 12 could also be due to results originally obtained from measurement of actually operating networks, where the network owner or tenant would then be able to physically replace or remove equipment to obtain a new configuration shown in FIG. 12.

Figure 13:
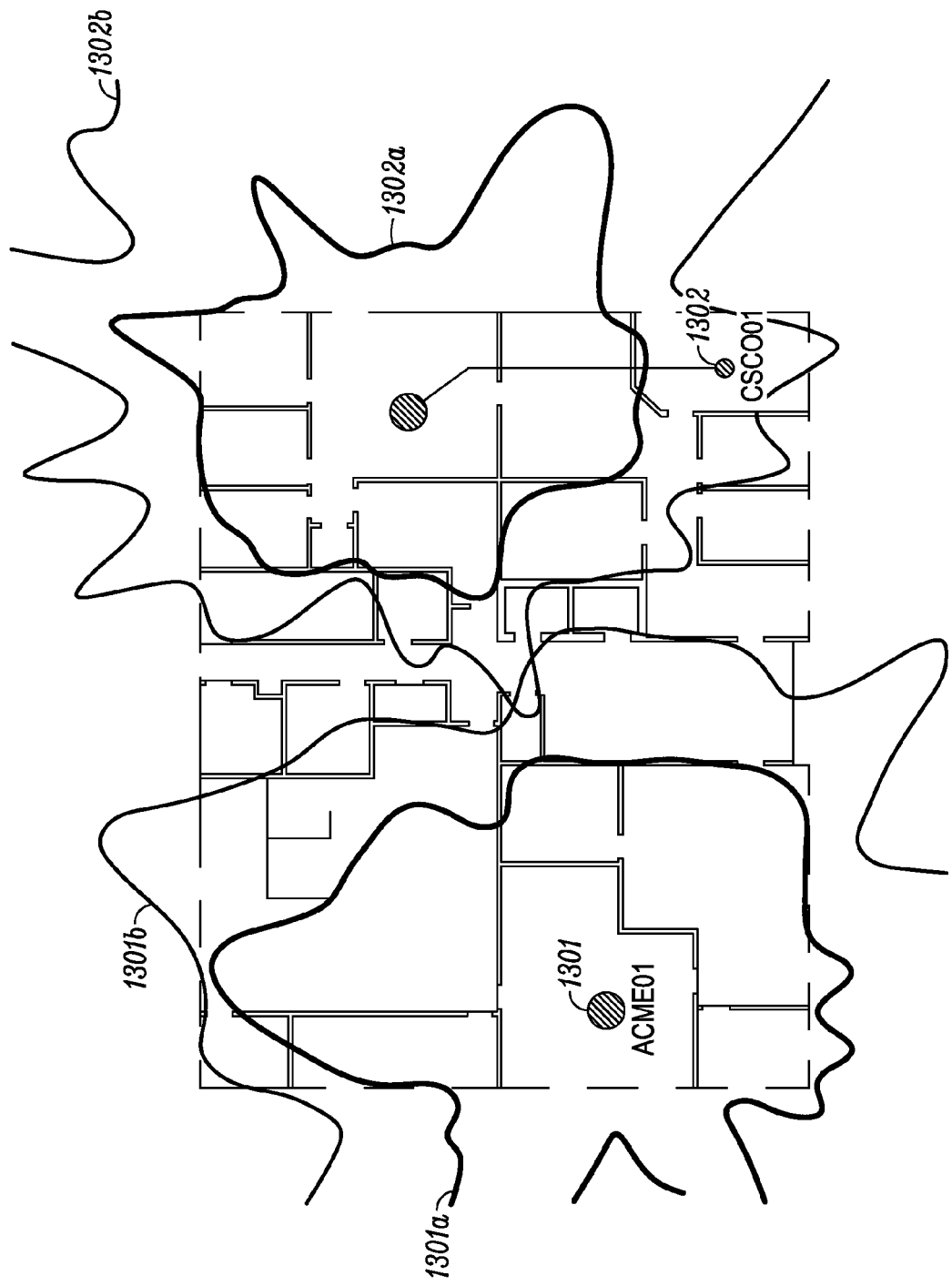
FIG. 13 shows a top-down view of a building floor plan containing predicted (or measured) coverage contours.

Referring to FIG. 13, the new predicted communication network performance in terms of coverage area is shown. In FIG. 12, the "Acme01" transceiver 1301 has predicted coverage boundaries shown for −60 dBm 1301a and −70 dBm 1301b respectively. Similarly, the "Csco01" transceiver 1302 has predicted coverage boundaries shown for −60 dBm 1302a and −70 dBm 1302b respectively. Note that the coverage boundaries now overlap one another in places, indicating an improvement in performance versus the original network configuration shown in FIG. 14. It is clear that FIG. 13 could also be due to results originally obtained from measurement of actually operating networks, where the network owner or tenant would then be able to physically replace or remove equipment to obtain a new configuration shown in FIG. 13.

Figure 14:
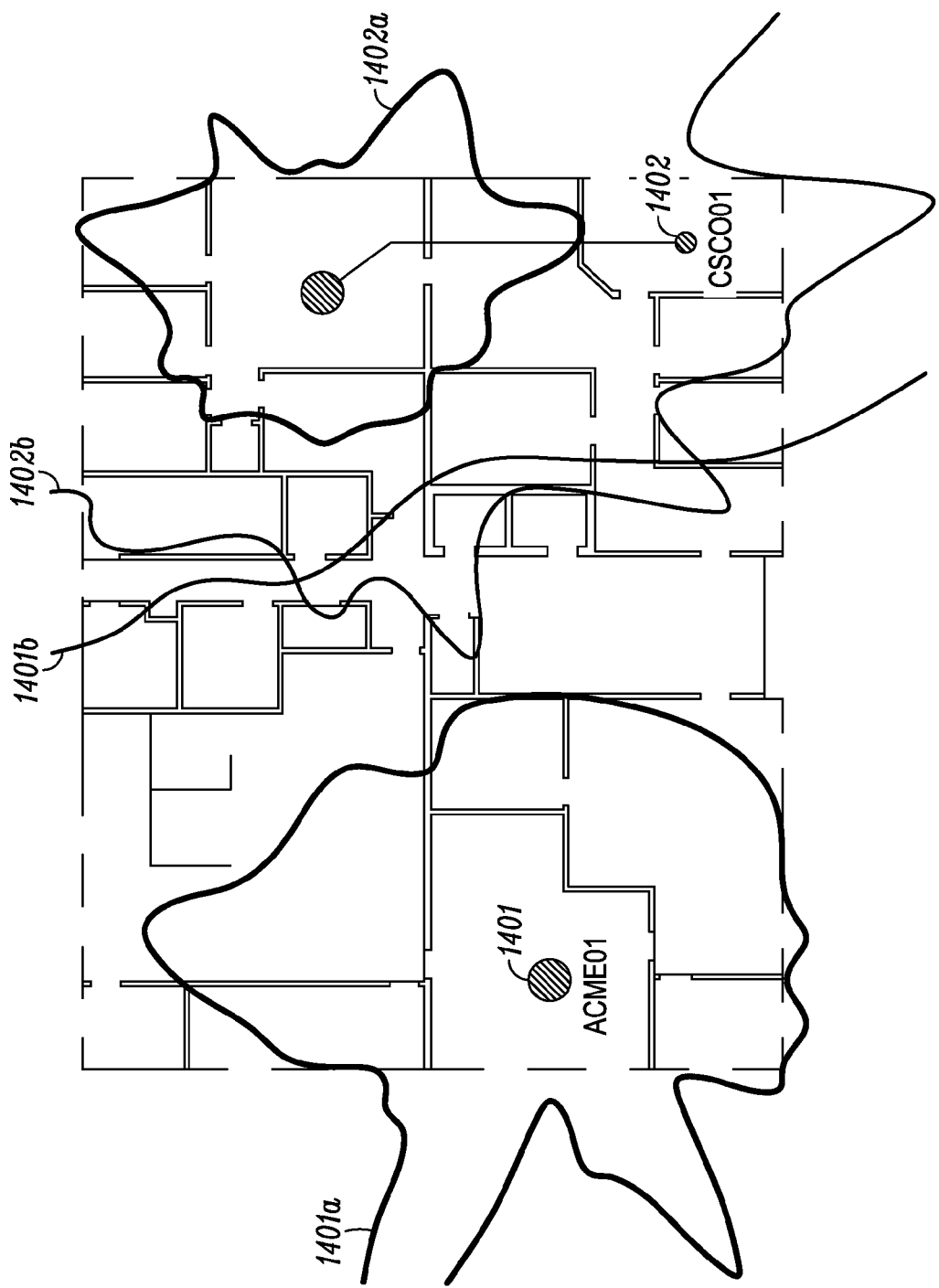
FIG. 14 shows a top-down view of a building floor plan containing predicted (or measured) interference contours.

Similarly, in FIG. 14 there is shown the predicted interference for the communication network defined in FIG. 12. As noted in FIG. 12, transceivers "Acme01" 1401 and "Csco01" 1402 have been recomputed and reconfigured by the invention such that they no longer share the same channel or frequency. Thus, they no longer directly interfere with one another as was the case originally. This is shown graphically in FIG. 14, where the transceiver "Acme01" 1401 has predicted interference boundaries shown for 30 dB signal-to-interference (SIR) 1401*a* and 10 dB SIR 1401*b* respectively. Similarly, transceiver "Csco01" 1402 has predicted interference boundaries shown for 30 dB SIR 1402*a* and 10 dB SIR 1402*b* respectively. Note that the interference contours now reflect the much improved performance of the revised network on the basis of signal-to-interference ratio (SIR). It is clear that the above illustration could easily have been implemented in an active network, where the same transceiver would have been used in the iterative process, so that the simulations would represent that actual installed and operation network. In such an instance, it would have then been possible to feed back the new settings of the hardware to the actual hardware devices, to affect the improved network conditions in an autonomous, remote controlled manner.

Figure 15A:
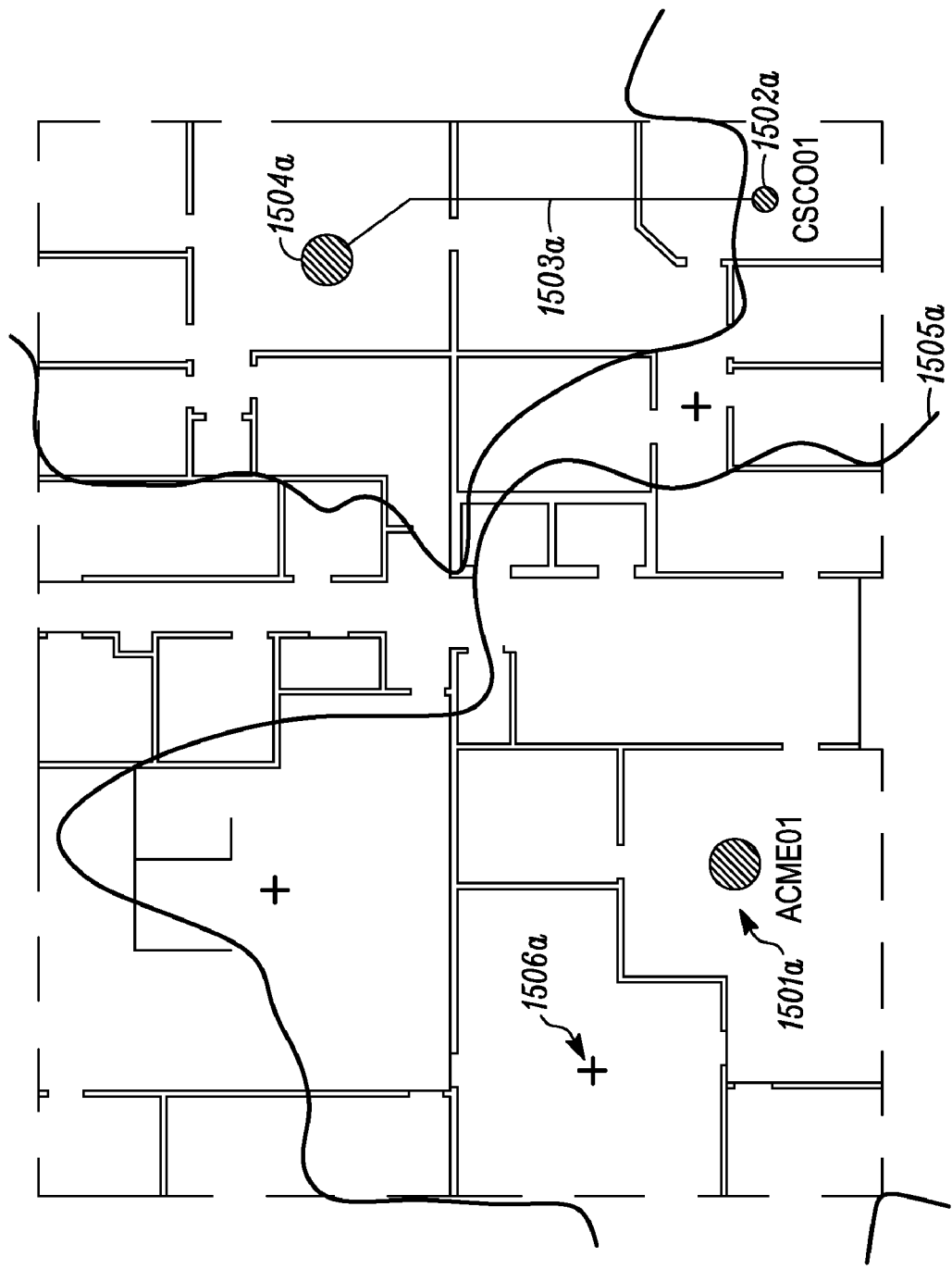
FIG. 15a shows a top-down view of a building floor plan containing new predicted (or measured) interference contours for equipment in revised positions.

In addition to analyzing different equipment types and configurations and/or settings to achieve some desirable level of network performance, the present invention may also analyze different equipment placements. Using the set of possible positions within the 2-D or 3-D model of the environment identified within FIGS. 7, 8*a*, and/or 8*b*, the invention may iterate equipment positions and perform performance predictions to gauge the desirability of the new positions on the overall network performance. Referring to FIG. 15*a*, the transceiver "Acme01" 301*a* from FIG. 3 has been repositioned to location 1501*a*. Transceiver "Csco01" 302*a* from FIG. 3 remains in its original position 1502*a*, as do its connected coaxial cable 1503*a* and antenna 1504*a*. The new predicted communication network performance in terms of coverage area is shown. In FIG. 15*a*, the "Acme01" transceiver 1501*a* and "Csco01" transceivers have predicted coverage boundaries shown for −70 dBm 1505*a*. Note that the coverage boundary for the "Acmo01" transceiver 1501*a* is now worse than when it was in its original position in FIG. 13.

Figure 15B:
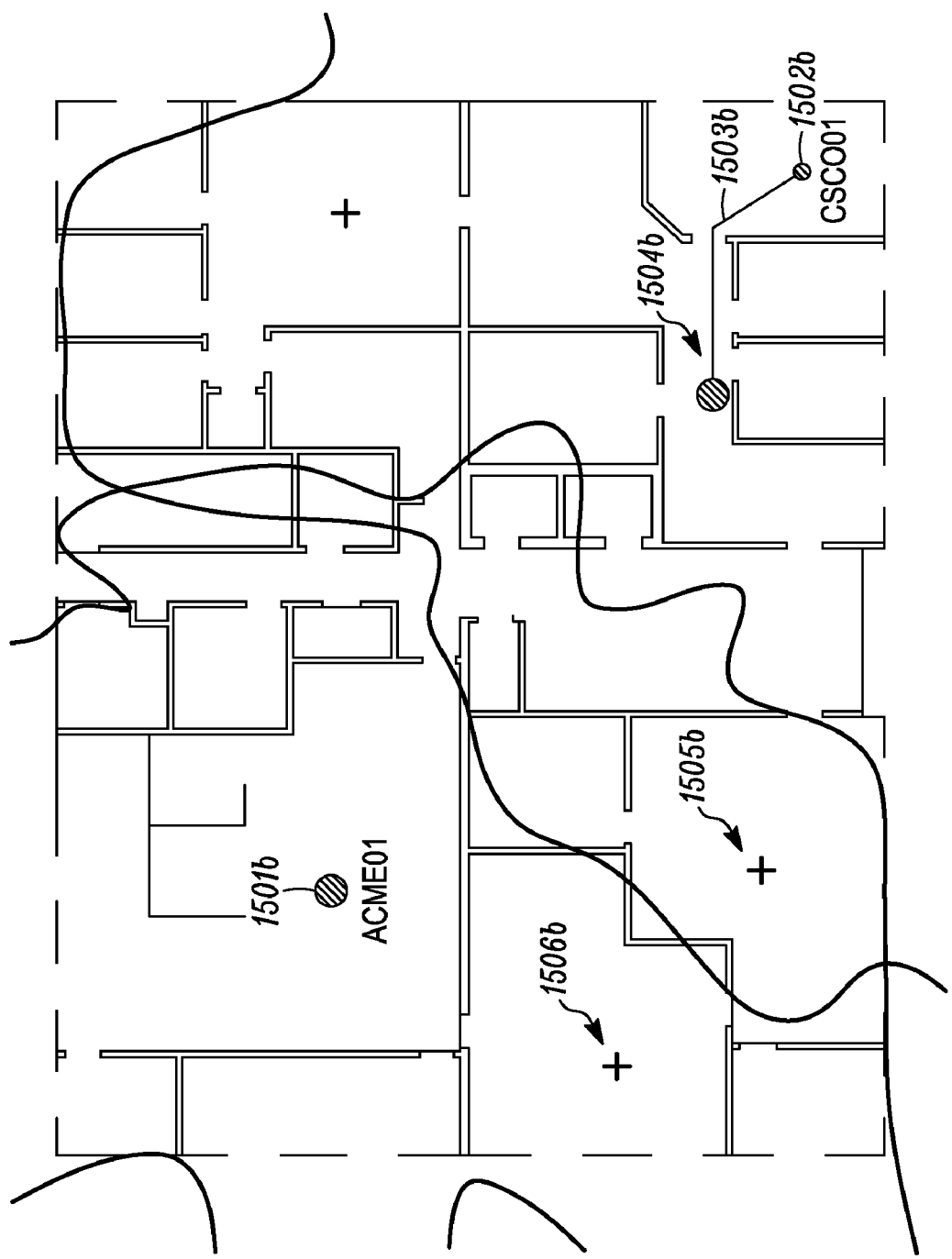
FIG. 15b shows a top-down view of the building floor plan of FIG. 15a after an iterating process of positioning equipment until an optimal network configuration is achieved.

Note the other possible equipment positions 1506*a* indicated in FIG. 15*a* that have either already been considered or are still available for consideration. The invention continues iterating equipment positions until it reaches an optimal or preferred network configuration. Referring to FIG. 15*b*, note the new positions for transceiver "Acme01" 1501*b*, transceiver "Csco01" 1502*b*, coaxial cable 1503*b*, and antenna 1504*b*. The new predicted communication network performance in terms of coverage area is shown. In FIG. 15*b*, the "Acme01" transceiver 1501*a* and "Csco01" transceivers have predicted coverage boundaries shown for −70 dBm 1505*b*. Note the significant overlap between the coverage boundaries 1505*b*, and the improvement over previous configurations shown in FIGS. 9, 13, and 15*a*. Through the process of iteration, the invention has identified optimal or preferred equipment placement to maximize the performance of the overall network.

In FIG. 15*b*, it is shown that the coaxial cable 1503*b* has been rerouted to provide a continual connection between transceiver "Csco01" 1502*b* and antenna 1504*b*. In the present invention, this automatic re-routing occurs on the basis of either shortest path (generally a straight line), shortest path avoiding obstacles (e.g., avoiding walls), or least cost. If the 2-D or 3-D model of the environment includes such information as cable trays, drop ceilings, or raised floors, such optimal or preferred paths for cable placement can be taken advantage of for the purpose of automatic cable routing to maintain connectivity between different pieces of equipment within the same network.

It should be understood that, in addition to remote control of the antenna pattern, the invention permits remotely controlling the channels, power levels, modulation, and other parameters. This provides a pre-install functionality, as well as an adaptive, real-time, remote control functionality.

Figure 16:
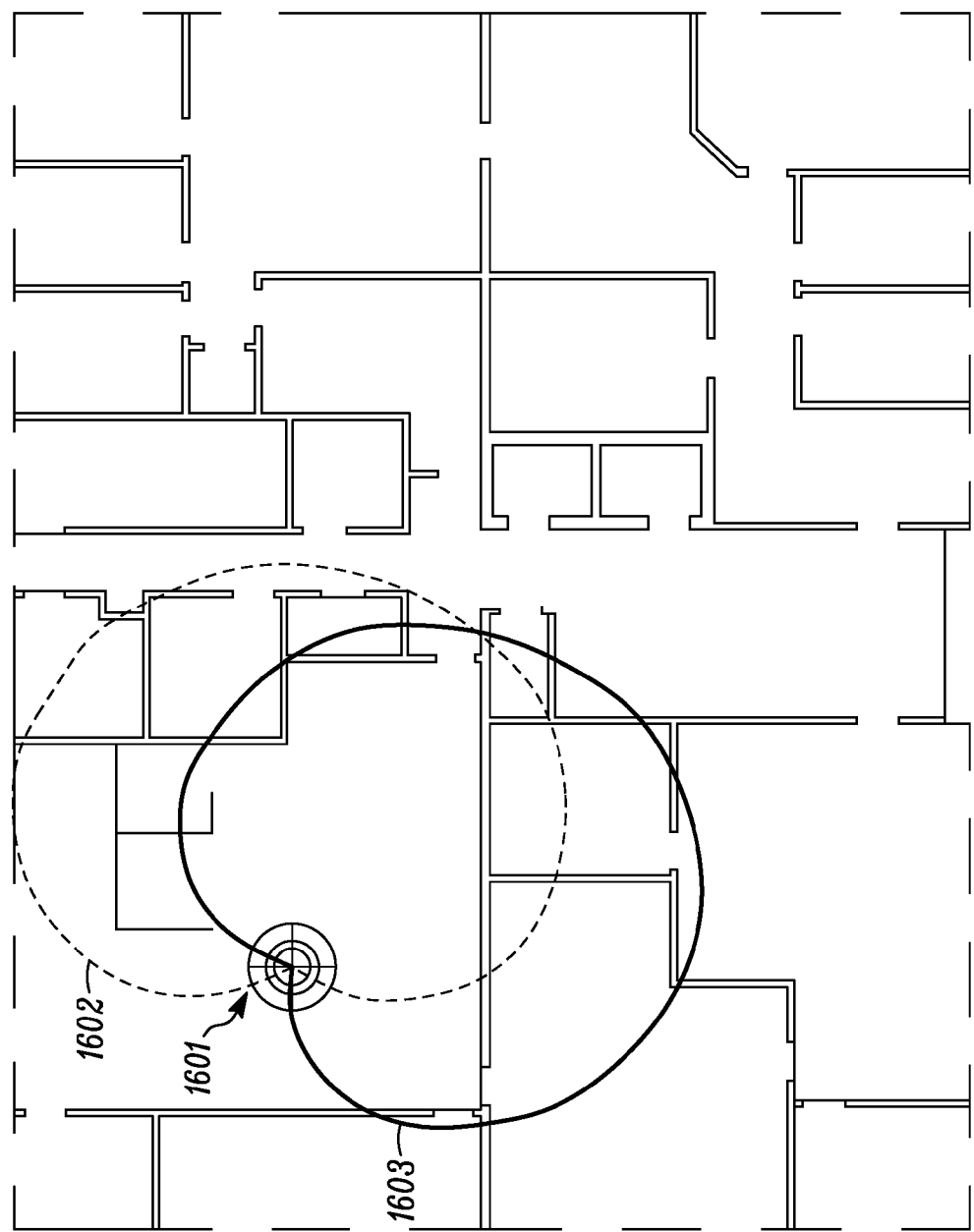
FIG. 16 shows a top-down view of a building floor plan containing equipment with antennas having been re-oriented in order to provide improved network performance.

In FIG. 16, there is shown an example of optimizing the configuration of an antenna (per step 108 in FIG. 1). For certain pieces of equipment such as antennas the primary means of configuration may be in the physical orientation of the device itself. In which case, the invention is able to determine the orientation of the equipment in the network that achieves the optimal or preferred or near-optimal performance. Note that the orientation can occur around any axis of rotation possible for the piece of equipment in three dimensions. In FIG. 16, the radiation pattern for the antenna 1601 in a particular orientation of the antenna is shown as the dashed line 1602. That is, the radiating characteristics of the antenna 1601 (e.g., the amount of RF power being transmitted from the antenna in every direction) is represented by the dashed line 1602. During the iterative processing loop, the invention analyzes the selected antenna in the various orientations identified for it in step 103 of FIG. 1 and further described in FIG. 6. The invention determines which of the selected configurations achieves the most desirable network performance as defined by the user in step 105 of FIG. 1. In FIG. 16, the solid line 1603 indicates the radiation pattern for the antenna 1601 for the orientation of the antenna identified by the invention as the preferred orientation to place the antenna 1601 in order to achieve a more desirable network performance. Note that recent technology advances in antennae technology have made it possible to manufacture antennas that can adjust their radiating characteristics without the need for physically reorienting the hardware. These antennas, commonly referred to as smart antennas or array antennas, if they can be remotely controlled or programmed via some form of communication link, whether through the Internet, wirelessly, or some other media, can be reconfigured by the invention through the remote equipment configuration and management process outlined in FIG. 18.

Although the example provided details a brute force algorithm for determining optimal or preferred equipment types, configurations, and/or positions, one skilled in the art could easily see how any other type of adaptive algorithm could be utilized to achieve the same or similar results. Similarly, one can immediately see how positions of client users could easily be predicted or determined using position location methods known now or in the future. Furthermore, by using the measurement capabilities provided through networked equipment, it is obvious that position location estimations may be conducted in real-time or in near-real-time, and could also be displayed, by comparing the measured signal levels from one or more portable client users with those of predicted position locations determined from propagation prediction modeling. By resolving the measured signal levels with predicted levels, it is possible to use the current invention and known methods to accurately perform position location tasks.

Note that although the example provided is specific to improved performance on the basis of coverage area and signal-to-interference ratio (SIR), it should be obvious to one skilled in the art that any combination of one or more performance criteria such as quality of service (QoS), coverage zones, bandwidth or throughput availability, QoS for particular users, classes of users, or subclasses of users, overall handoff zones, overall data rate availability or data rate availability for particular users, classes of users, subclasses of users, overall or specific packet error rate, packet throughput, packet latency, bit error rate, signal-to-noise ratio (SNR), carrier-to-noise ratio (CNR), signal strength or RSSI, rms delay spread, distortion, or any other performance criteria such as cost, equipment vendor set, low-maintenance equipment, easy to install equipment, etc., known now or in the future could be utilized in performing similar network improvements.

Figure 17:
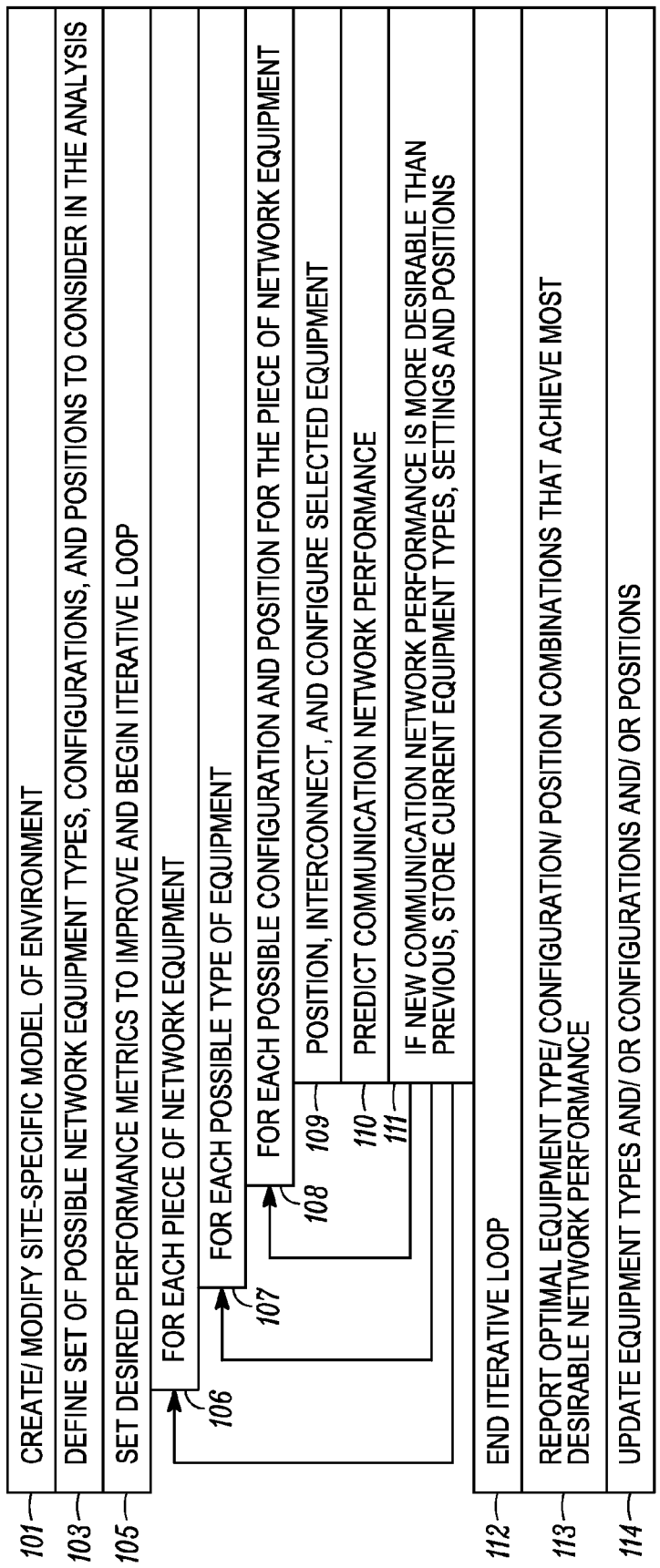
FIG. 17 shows an alternate method of the preferred invention involving iteratively determining the placement of new network equipment.

Referring now to FIG. 17, there is shown an alternate method of the current invention. The method shown in FIG. 17 follows closely the method of FIG. 1 with several exceptions. In the alternate method of FIG. 17, steps 102 and 104 of FIG. 1 are skipped, enabling the invention to predict the placement and configuration of a number of new selected equipment types within the 2-D or 3-D modeled environment. Through the method of FIG. 17, the present invention can determine the number, type, interconnection, configuration, and placement of a finite number of network infrastructure equipment that best satisfy the desired performance criteria set in step 105. This is a novel and powerful capability that enables the invention to automatically (or with user-interaction) predict for any wired or wireless network of equipment the optimal or preferred or near optimal number, type, configuration, interconnection, and position of individual pieces of equipment that should comprise the network in order to achieve a desirable level of performance.

The final step of the process of the invention as outlined in FIG. 1 and FIG. 17 is the update of the type and/or configuration of each physical piece of equipment in the actual communications network that corresponds to the computer representation of the equipment in the site-specific computer model 114. In this step, a real-time communication link is established between the invention and the physical piece of equipment represented within the site-specific computer model. This communication link may be via the Internet, infrared, wireless, or any other form of electronic or communication medium or protocol supporting method. When placing and positioning equipment within the site-specific computer model 102, the user may define the method by which the physical piece of equipment being represented within the site-specific computer model of the environment may be contacted via a communication link. This method will vary depending on the type of communication supported by the piece of equipment. For example, a piece of equipment that supports communication via the Internet may be identified by an Internet Protocol (IP) address and the command set to which it will respond.

Once a communication link is established between the invention and the physical piece of equipment, the invention transmits the command instructions appropriate for the given device (as defined by the user in step 102 of FIG. 1) and sends the new optimal or preferred configuration information. The physical piece of equipment receives the new configuration information and adjusts its internal settings accordingly. Note that this form of automated update of equipment is only available with certain devices that provide for the ability to be remotely configured. It is also impossible to update the actual type of equipment in this manner. Such an update requires a full replacement of the physical component with a different piece of equipment.

It should be clear that the invention may be implemented, viewed, displayed, or used using a remote client-server application, an application service provider model, or on or over the world wide web or Internet.

Figure 18:
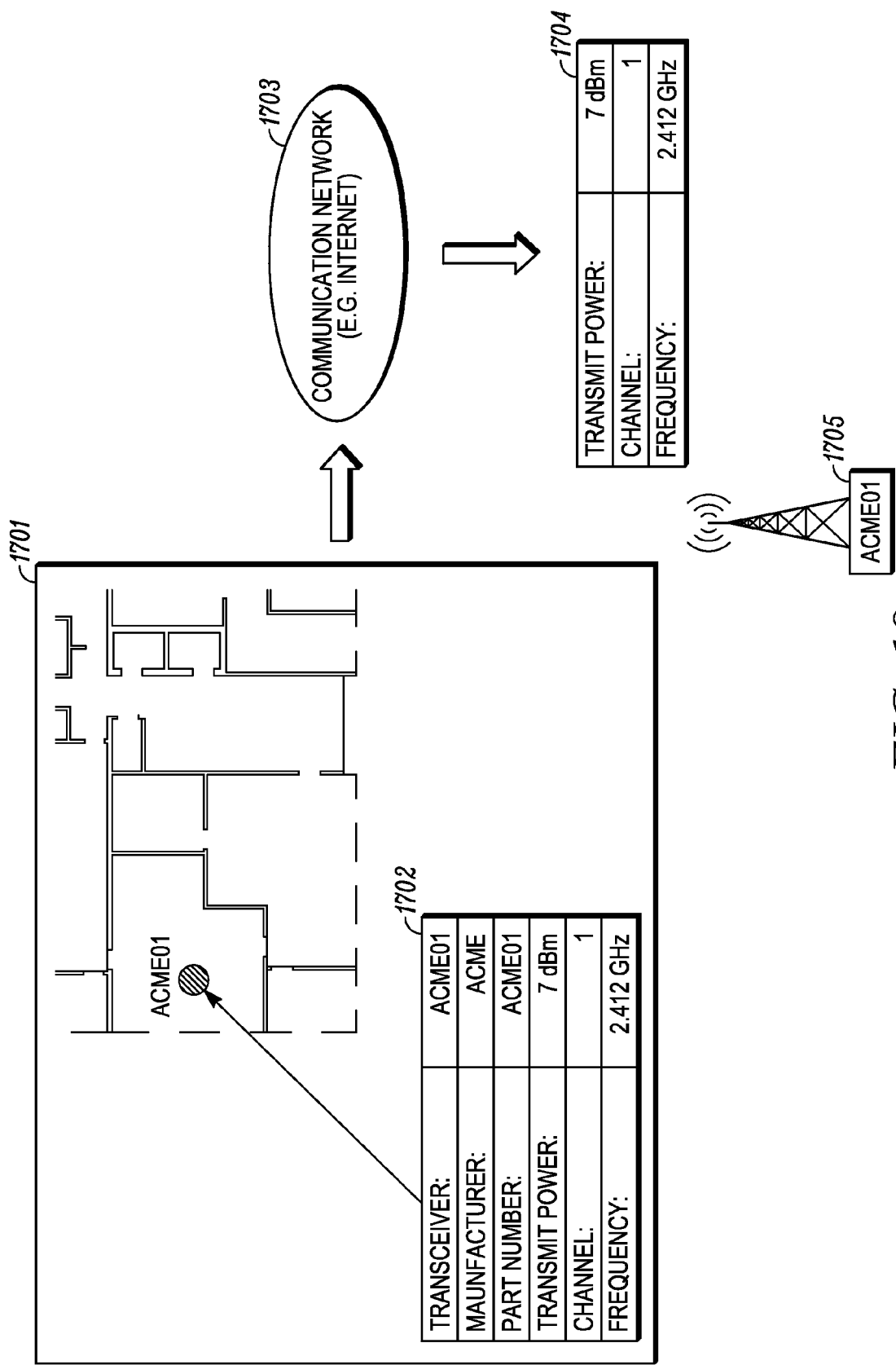
FIG. 18 shows a diagram illustrating the process whereby existing network equipment may be re-configured or re-adjusted remotely according to the invention.

FIG. 18 depicts the typical situation for the communication link between the invention and a remote piece of equipment (or some other component such as an adaptive or adjustable antenna, etc.). The invention maintains a site-specific model of the environment in which the piece of equipment is deployed or is to be deployed, and maintains a model and description of the piece of equipment itself 1801. Through the automated method described previously, the invention has determined the appropriate configuration for the piece of equipment in order to achieve some desirable performance goal for the network 1802. The invention establishes a communication link with the physical component (e.g. the piece of equipment 1805) via some medium 1803. The relevant configuration information 1804 is transmitted to the piece of equipment 1805, which receives the information and takes the appropriate steps necessary to adjust its settings accordingly.

While the invention has been described in terms of its preferred embodiments, those skilled in the art will recognize that the invention can be practiced with considerable modification within the spirit and scope of the appended claims. For example, the CAD application program as described herein could be simplified to be a low cost software application that serves as a simple 2-D or 3-D front end graphical user interface to a computational engine that is implemented in integrated circuit or embedded software form. In fact, a portion of the invention itself could be mass produced and embedded within chips or software that is shipped within wireless transceivers, or within other active components used within a network, whereas another portion of the invention could be provided on CD ROM or other software medium provided with each access point or active component that was sold, or with operating systems sold or packaged on computers that control or connect with transceivers and hardware. Thus, for example, a combination of the CD ROM computer software with a connected network of components would allow a user to provide adaptive network design simulations on his or her PC (before a network were built) but also could provide adaptive control of an actual installed network. In another example of the invention, each wireless transceiver or other component might have with it a software application, either embedded in software, implemented in integrated-circuit form, sent via file download, or supplied with a CD ROM or some other medium, capable of enabling the performance of some or all of the functions detailed in the described invention, so that a user could be assured of having a powerful design, prediction, deployment, maintenance, and on-going adaptive network control capability in any wireless transceiver, access point, or equipment component that she bought. It should be clear that the invention is not limited just to wireless communication networks, but may be used to present any type of electromagnetic characteristics superimposed on any simulated physical environment. For example, the invention would find application in the next generation field of smart cards, smart tags, or micro-machines and nanomachines or micro-electrical-mechanical machines (MEMS). These tags or machines are extremely small yet highly sophisticated functional elements that allow them to perform complicated tasks in hard-to-access locations, such as inside cargo containers, embedded within buildings, the human body, in plumbing, in jet engines, etc.

For security and sensing networks, such tags or devices will become more important. For example, small sensors that can be made to detect when a package has been opened or tampered with may be constructed using MEMS capabilities. If an envelope or container is opened, a tiny spring may be activated which would flip a binary logic device, thereby indicating tampering—by using small RF devices (passive smart cards), a local reader could detect the tampering condition and send this information to a controller or maintain it in a portable reading device. The invention could be used to provide provisioning and then control of such a network of smart cards, say on board a cargo ship, inside a post office, within a library, or in other locations where security or assured sensing or network control must be maintained, even if the data rate is low. Another application of the disclosed invention would be for a new type of network herein disclosed: a network of new devices that do not yet exist—the new device is what we call the "wireless post-it", which is likely to emerge some day due to the continuing pervasiveness of wireless networks and Wireless LANs. The wireless post-it is a massive memory, made of silicon, GaAs, or some other material or composites, and is integrated with a passive RF smart card device, the complete invention being about the size of a small index card or a small post—it note. The wireless post-it could contain the equivalent of one or more books, and is much lighter, much cheaper to produce, and much more portable. The wireless post-it can be programmed at manufacturer (like a pre-recorded CD or record), or can be programmed, written to, and re-written to by a local application or by downloadable means. Normally passive, when illuminated by a local RF generating reader device, the post-it note receives enough power via RF carrier, and a simple instruction to transmit a part or all of its memory contents over a wireless or infrared link to the reader device. Each post-it would have a unique or semi-unique address (like a copyright notice or some other ID that enables wireless post-its to be identified from one another in content). These wireless post-it and reader devices are likely to operate at frequencies above 5 GHz, and will be used over very small distances, within a room, and perhaps shall be used in the 58-65 GHz band, or in even higher frequency bands where great bandwidths are now being provided for in a license-free fashion by the FCC. In this way, it will be possible to store books, encyclopedias, and massive data, such as computer hard drives and other memory devices, which today are typically found on book shelves, or which take up space because of bulk, and which could be downloaded very quickly due to the great bandwidths. Note, however, with the proper power and antenna parameters or settings provided with a cradle or attachment for the reader, or with a series of repeaters located in close proximity to the actual wireless post-it), the portable reader can be left unattended in the room and connected to an Ethernet or optical backbone, where it then becomes possible to remotely control the reader via remote computer control so that the reader is then able to download contents of specific wireless post-its in the room and send such data throughout the world via Ethernet or Internet means. Clearly, addressing could be done to allow proper control of readers and wireless post-its. The remote access of books would allow someone to retrieve information over the internet, and such retrieval could be done wirelessly via internet connection to the reader in the room, so that someone does not have to lug the book from the bookshelf each time they wish to read information. The adaptive control of such networks that would support this novel wireless post-it concept is one example of potential application of the disclosed invention.

For example, the invention could be used where it will be necessary to both wirelessly communicate with these wireless post-its or sensors or machines as well as wirelessly provide power or recharging for these machines, such as in the form of RF pulses, infrared (IR) light or any other form of electromagnetic medium. The present invention would therefore facilitate the optimal or preferred configuration of this or any other wireless electromagnetic system. Furthermore, it should be clear that while the invention has been described as communicating with fixed infrastructure, it should be clear that the network infrastructure could itself be mobile or portable, such as in the case of ad-hoc networks. In addition, it should be clear that this invention could be implemented if standard protocols were developed between networking equipment and distributed equipment (such as home appliances or other mass produced products) such that cost, maintenance, configuration, control and measurement data could be passed easily and stored at network components, as well as stored at a CAD application, that itself is either stand-alone, embedded within software, or implemented in an integrated-circuit fashion.

Having thus described our invention, what we claim as new and desire to secure by Letters Patent is as follows:

1. A system for modeling or controlling a communications network, comprising:
    a display for displaying a site map of a site in which a communications network is or will be deployed;
    means for configuring a computer representation on said site map on said display a possible configuration of a communications network which includes a plurality of components which are or may be used in the communications network, one or more of said plurality of components having at least one of performance data, cost data, maintenance data, and equipments settings stored in a database;
    means for establishing one or more parameters of a desirable configuration of said communications network;
    means for changing at least one of
    a) one or more components within said configuration of said communications network, and
    b) equipment settings of one or more components within said configuration of said communications network;
    means for determining predicted or measured parameters for said communications network within said site generated by said means for configuring and said means for changing; and
    means for determining one or more optimized or preferred configurations of said communications network based on a comparison of predicted or measured parameters generated by said means for determining and said one or more parameters of said desirable configuration established by said means for establishing.

2. The system of claim 1 further comprising a means for adjusting equipment settings of one or more components in said communications network based on an optimized or preferred configuration obtained from said means for determining.

3. The system of claim 2 wherein said means for adjusting adjusts one or more of transmit power settings, input and output gain settings, channel settings, frequency settings, bandwidth of transmitted or received signal, modulation schemes, data or symbol rate, protocol stack, coding, user priority settings or allowances, antenna pointing, antenna phasing parameters, orientation of component, and location of component.

4. The system of claim 2 wherein said communications network is deployed within said site, and said means for adjusting is operated locally at said site.

5. The system of claim 2 wherein said communications network is deployed within said site, and said means for adjusting is operated remote from said site.

6. The system of claim 5 wherein said means for adjusting is operated over the Internet.

7. The system of claim 5 wherein said means for adjusting is operated over one of communication protocols, wireless networks, wired networks, and passive or active wireless RF tags.

8. The system of claim 1 wherein said means for determining determines measured parameters for said communications network.

9. The system of claim 8 further comprising means for inputting measured parameters into said computer representation configured by said means for configuring.

10. The system of claim 1 wherein said means for determining determines predicted parameters for said communications network.

11. The system of claim 1 wherein said one or more parameters of said desirable configuration established by said means establishing are selected from the group consisting of coverage, capacity, coverage for a specific user class, specific capacity for a user class, coverage for a subset of users, capacity for a subset of users, handoff rate, dropped call rate, blocked call rate, dropped packet rate, symbol error rate, symbol rate, acceptable coverage zones, throughput including average, peak, individual, group, class or subclass, bit error rate, packet error rate, frame error rate, signal level, quality of service, latency, signal-to-noise ratio, carrier-to-noise ratio, signal strength, RSSI, rms delay spread, position location, interference levels, carrier to interference levels, and distortion.

12. The system of claim 1 wherein said one or more parameters of said desirable configuration established by said means for establishing are selected from the group consisting of installation cost information, equipment cost information, performance information, relative performance information, and maintenance cost information.

13. The system of claim 1 wherein said one or more parameters of said desirable configuration established by said means for establishing includes at least two different parameters for different subsets of users.

14. The system of claim 1 wherein said equipment settings of said one or more components within said configuration of said communications network, are selected from the group consisting of one or more of transmit power settings, input and output gain settings, channel settings, frequency settings, bandwidth of transmitted or received signal, modulation schemes, data or symbol rate, protocol stack, coding, user priority settings or allowances, antenna pointing, antenna phasing parameters, and orientation of component.

15. The system of claim 1 wherein said means for displaying provides a two dimensional display.

16. The system of claim 1 wherein said means for displaying provides a three dimensional display.

17. The system of claim 1 wherein one or more physical objects in said site map are assigned properties which are considered by said means for determining predicted or measured parameters for said communications network.

18. The system of claim 17 wherein said properties are selected from the group consisting of attenuation, surface roughness, width, material, reflection coefficient, absorption, color, motion, scattering effects, weight, thickness, partition type and loss values.

19. The system of claim 1 wherein said site map includes at least one of external walls, internal walls, cubicle walls, doors, ceilings, floors, furniture and windows, of at least part of one building.

20. The system of claim 1 wherein one or more components of said plurality of components are selected from the group consisting of base stations, base station controllers, amplifiers, attenuators, antennas, coaxial cabling, fiber optic cabling, splitters, repeaters, transducers, converters, couplers, leaky feeder cables, hubs, switches, routers, firewalls, MIMO systems, sensors, power distribution lines, wiring, twisted pair cabling and wireless or other access points.

21. The system of claim 1 further comprising means for creating or maintaining records for said communications network.

22. The system of claim 21 wherein said records are selected from the group consisting of alarm records, malfunction records, equipment upkeep costs, equipment installation costs, predicted upkeep costs, equipment use costs, equipment maintenance history, depreciation records, tax records, equipment warranty information, licensing information, owner information, tenant information, vendor information, installer information, lessor information, lessee information, electronic equipment identifier information, bar code information, manufacturer information, event statistics, outage rates, internet protocol address information, wireless address information, and digital signature information.

23. The system of claim 1 wherein said one or more parameters of said desirable configuration are selected from radio signal strength intensity, connectivity, network throughput, bit error rate, frame error rate, signal-to-interference ratio, signal-to-noise ratio, frame resolution per second, traffic, capacity, signal strength, throughput, error rates, packet latency, packet jitter, symbol jitter, quality of service, security, coverage area, bandwidth, server identification parameters, transmitter identification parameters, best server locations, transmitter location parameters, billing information, network performance parameters, CII, C/N, body loss, height above floor, height above ground, noise figure, secure coverage locations, propagation loss factors, angle of arrival, multipath components, multipath parameters, antenna gains, noise level reflectivity, surface roughness, path loss models, attenuation factors, throughput performance metrics, packet error rate, round trip time, dropped packet rate, queuing delay, signal level, interference level, quality of service, bandwidth delay product, handoff delay time, signal loss, data loss, number of users serviced, user density, locations of adequate coverage, handoff locations, locations of adequate throughput, E,I, system performance parameters, equipment price, maintenance and cost information, user class or subclass, user type, position location, all in either absolute or relative terms.

24. The system of claim 1 further comprising an alarm which is activated when said measured parameters for said communications network determined by said means for determining is below a pre-established level.

25. The system of claim 24 wherein said alarm issues a page or a call or email alert.

26. The system of claim 24 wherein said alarm triggers a shut down or reduction in power or data rates in the communications network.

27. The system of claim 24 further comprising means for responding to said alarm.

28. The system of claim 1 further comprising an alarm which is activated in response to a self test of at least one of said plurality of components.

29. The system of claim 28 further comprising a means for automatically performing said self test.

30. The system of claim 1 further comprising a means for performing a diagnostic routine on at least one of said plurality of components which are used in the communications network, and means for reporting results of said diagnostic routine to said means for determining.

31. The system of claim 1 wherein said means for changing automatically changes in an iterative process a type of component of said one or more components.

32. The system of claim 1 wherein said means for changing manually changes in an iterative process a type of component of said one or more components.

33. The system of claim 1 wherein said means for changing automatically changes in an iterative process a manufacturer of said one or more components.

34. The system of claim 1 wherein said means for changing manually changes in an iterative process a manufacturer of said one or more components.

35. The system of claim 1 wherein said means for changing automatically changes in an iterative process a location of a component of said one or more components.

36. The system of claim 1 wherein said means for changing manually changes in an iterative process a location of a component of said one or more components.

37. The system of claim 1 wherein said means for changing automatically changes in an iterative process one or more of transmit power, channel or frequency, bandwidth, data rate, antenna type, antenna sector or positioning, modulation or coding type, protocol, data rate, switching in a spare component, resetting, or changing settings of a component of said one or more components.

38. The system of claim 1 wherein said means for changing automatically changes in an iterative process an orientation of a component of said one or more components.

39. The system of claim 1 wherein said means for changing manually changes in an iterative process an orientation of a component of said one or more components.

40. The system of claim 1 further comprising a means for obtaining measured performance data for equivalent components to at least one of said plurality of components in said communications network, wherein said equivalent components are used in another communications network.

41. The system of claim 40 wherein said performance data for equivalent components is stored in a relational database.

42. The system of claim 1 further comprising a means for obtaining at least one of performance data, cost data, maintenance data, and equipment settings for at least one of said components of said plurality of components from a relational database.

43. The system of claim 1 further comprising a means for obtaining at least one of performance data, cost data, maintenance data, and equipment settings for at least one of said components of said plurality of components from a source or sources on the Internet.

44. The system of claim 1 wherein said means for configuring includes a means for automatically identifying a set of possible locations for at least one of said plurality of components on said site map.

45. The system of claim 1 further comprising a feedback means for providing comparisons of measured parameters with predicted parameters.

46. The system of claim 45 wherein said feedback means is operated automatically over time.

47. A method for modeling or controlling a communications network, comprising:
displaying a site map of a site in which a communications network is or will be deployed;
configuring a computer representation on said site map on said display a possible configuration of a communications network which includes a plurality of components which are or may be used in the communications network, one or more of said plurality of components having at least one of performance data, cost data, maintenance data, and equipment settings stored in a database;
establishing one or more parameters of a desirable configuration of said communications network;
changing at least one of
a) one or more components within said configuration of said communications network, and
b) equipment settings of one or more components within said configuration of said communications network;
determining predicted or measured parameters for said communications network within said site generated by said configuring step and said changing step; and
determining one or more optimized or preferred configurations of said communications network based on a comparison of predicted or measured parameters generated by said determining step and said one or more parameters of said desirable configuration established by said establishing step.

48. The method of claim 47 further comprising the step of adjusting equipment settings of one or more components in said communications network based on an optimized or preferred configuration obtained from said determining step.

49. The method claim 48 wherein said adjusting step adjusts one or more of transmit power settings, input and output gain settings, channel settings frequency settings, bandwidth of transmitted or received signal, modulation schemes, data or symbol rate, protocol stack, coding, user priority settings or allowances, antenna pointing, antenna phasing parameters, orientation of component, and location of component.

50. The method of claim 48 wherein said communications network is deployed within said site, and said adjusting step is performed locally at said site.

51. The method of claim 48 wherein said communications network is deployed within said site, and said adjusting step performed remote from said site.

52. The method of claim 48 wherein said adjusting step is operated over the Internet.

53. The method of claim 48 wherein said adjusting step is operated over one of communication protocols, wireless networks, wired networks, and passive or active wireless RF tags.

54. The method of claim 47 wherein said determining step determines measured parameters for said communications network.

55. The method of claim 54 further comprising the step of inputting measured parameters into said computer representation configured in said configuring step.

56. The method of claim 47 wherein said determining step determines predicted parameters for said communications network.

57. The method of claim 47 wherein said one or more parameters of said desirable configuration established in said establishing step are selected from the group consisting of coverage, capacity, coverage for a specific user class, specific capacity for a user class, coverage for a subset of users, capacity for a subset of users, handoff rate, dropped call rate, blocked call rate, dropped packet rate, symbol error rate, symbol rate, acceptable coverage zones, throughput including average, peak, individual, group, class or subclass, bit error rate, packet error rate, frame error rate, signal level, quality of service, latency, signal-to-noise ratio, carrier-to-noise ratio, signal strength, RSSI, rms delay spread, position location, interference levels, carrier to interference levels, and distortion.

58. The method of claim 47 wherein said one or more parameters of said desirable configuration established in said establishing step are selected from the group consisting of installation cost information, equipment cost information, performance information, relative performance information, and maintenance cost information.

59. The method of claim 47 wherein said one or more parameters of said desirable configuration established in said establishing step includes at least two different parameters for different subsets of users.

60. The method of claim 47 wherein said equipment settings of said one or more components within said configuration of said communications network, are selected from the group consisting of one or more of transmit power settings, input and output gain settings, channel settings frequency settings, bandwidth of transmitted or received signal, modulation schemes, data or symbol rate, protocol stack, coding, user priority settings or allowances, antenna pointing, antenna phasing parameters, and orientation of component.

61. The method of claim 47 wherein said displaying step provides a two dimensional display.

62. The method of claim 47 wherein said displaying step provides a three dimensional display.

63. The method of claim 47 wherein one or more physical objects in said site map are assigned properties which are considered by said step of determining predicted or measured parameters for said communications network.

64. The method of claim 63 wherein said properties are selected from the group consisting of attenuation, surface roughness, width, material, reflection coefficient, absorption, color, motion, scattering effects, weight, thickness, partition type and loss values.

65. The method of claim 47 wherein said site map includes at least one of external walls, internal walls, cubicle walls, doors, ceilings, floors, furniture and windows, of at least part of one building.

66. The method of claim 47 wherein one or more components of said plurality of components are selected from the group consisting of components are selected from the group consisting of base stations, base station controllers, amplifiers, attenuators, antennas, coaxial cabling, fiber optic cabling, splitters, repeaters, transducers, converters, couplers, leaky feeder cables, hubs, switches, routers, firewalls, MJMO systems, sensors power distribution lines, wiring, twisted pair cabling and wireless or other access points.

67. The method of claim 47 further comprising the step of creating or maintaining records for said communications network.

68. The method of claim 67 wherein said records are selected from the group consisting of alarm records, malfunction records, equipment upkeep costs, equipment installation costs, predicted upkeep costs, equipment use costs, equipment maintenance history, depreciation records, tax records, equipment warranty information, licensing information, owner information, tenant information, vendor information, installer information, lessor information, lessee information, electronic equipment identifier information, bar code information, manufacturer information, event statistics, outage rates, internet protocol address information, wireless address information, and digital signature information.

69. The method of claim 47 wherein said one or more parameters of said desirable configuration are selected from radio signal strength intensity, connectivity, network throughput, bit error rate, frame error rate, signal-to-interference ratio, signal-to-noise ratio, frame resolution per second, traffic, capacity, signal strength, throughput, error rates, packet latency, packet jitter, symbol jitter, quality of service, security, coverage area, bandwidth, server identification parameters, transmitter identification parameters, best server locations, transmitter location parameters, billing information, network performance parameters, CII, CIN, body loss, height above floor, height above ground, noise figure, secure coverage locations, propagation loss factors, angle of arrival, multipath components, multipath parameters, antenna gains, noise level reflectivity, surface roughness, path loss models, attenuation factors, throughput performance metrics, packet error rate, round trip time, dropped packet rate, queuing delay, signal level, interference level, quality of service, bandwidth delay product, handoff delay time, signal loss, data loss, number of users serviced, user density, locations of adequate coverage, handoff locations, locations of adequate throughput, EJ, system performance parameters, equipment price, maintenance and cost information, user class or subclass, user type, position location, all in either absolute or relative terms.

70. The method of claim 47 further comprising the step of activating an alarm when said measured parameters for said communications network determined in said determining step is below a pre-established level.

71. The method of claim 70 wherein said alarm issues a page or a call or email alert.

72. The method of claim 70 wherein said alarm triggers a shut down or reduction in power or data rates in the communications network.

73. The method of claim 70 further comprising the step of responding to said alarm.

74. The method of claim 47 further comprising the step of activating an alarm in response to a self test of at least one of said plurality of components.

75. The method of claim 74 further comprising the step of automatically performing said self test.

76. The method of claim 47 further comprising the steps of performing a diagnostic routine on at least one of said plurality of components which are used in the communications network, and reporting results of said diagnostic routine.

77. The method of claim 47 wherein said changing step automatically changes in an iterative process a type of component of said one or more components.

78. The method of claim 47 wherein said changing step manually changes in an iterative process a type of component of said one or more components.

79. The method of claim 47 wherein said changing step automatically changes in an iterative process a manufacturer of said one or more components.

80. The method of claim 47 wherein said changing step manually changes in an iterative process a manufacturer of said one or more components.

81. The method of claim 47 wherein said changing step automatically changes in an iterative process a location of a component of said one or more components.

82. The method of claim 47 wherein said changing step manually changes in an iterative process a location of a component of said one or more components.

83. The method of claim 47 wherein said changing step automatically changes in an iterative process one of transmit power, channel or frequency, bandwidth, data rate, antenna type, antenna sector or positioning, modulation or coding type, protocol, data rate, switching in a spare component, resetting, or changing settings of a component of said one or more components.

84. The method of claim 47 wherein said changing step manually changes in an iterative process one of transmit power, channel or frequency, bandwidth, data rate, antenna type, antenna sector or positioning, modulation or coding type, protocol, data rate, switching in a spare component, resetting, or changing settings of a component of said one or more components.

85. The method of claim 47 wherein said changing step automatically changes in an iterative process an orientation of a component of said one or more components.

86. The method of claim 47 wherein said changing step manually changes in an iterative process an orientation of a component of said one or more components.

87. The method of claim 47 further comprising the step of obtaining measured performance data for equivalent components to at least one of said plurality of components in said communications network, wherein said equivalent components are used in another communications network.

88. The method of claim 87 wherein said performance data for equivalent components is stored in a relational database.

89. The method of claim 47 further comprising the step of obtaining at least one of performance data, cost data, maintenance data, and equipment settings for at least one of said components of said plurality of components from a relational database.

90. The method of claim 47 further comprising the step of obtaining at least one of performance data, cost data, maintenance data, and equipment settings for at least one of said components of said plurality of components from a source or sources on the Internet.

91. The method of claim 47 wherein said configuring step includes the step of automatically identifying a set of possible locations for at least one of said plurality of components on said site map.

92. The method of claim 47 further comprising the step of providing feedback for providing comparisons of measured parameters with predicted parameters.

93. The method of claim 92 wherein said feedback means is operated automatically over time.

94. A system for modeling a communications network, comprising:
a display for displaying a site map of a site in which a communications network is or will be deployed;
means for identifying locations on said site map where placement of one or more components of said communications network are not desirable or are desirable;
means for establishing one or more parameters of a desirable configuration of said communications network;
means for configuring a computer representation on said site map on said display a possible configuration of a communications network which includes a plurality of said one or more components which are or may be used in the communications network, one or more of said components having at least one of performance data, cost data, maintenance data, and equipment settings stored in a database, said means for configuring positioning on said site map computer representations of said one or more components only at locations which are desirable and not at locations which are not desirable; and
means for determining one or more optimized or preferred configurations of said communications network based on a comparison of predicted or measured parameters for a configuration generated by said means for configuring with said one or more parameters of said desirable configuration established by said means for establishing.

95. The system of claim 94 wherein said means for configuring includes a means for iteratively positioning a computer representation of at least one component of said one or more components at a plurality of desirable locations identified by said means for identifying.

96. The system of claim 95 wherein said means for iteratively positioning is automated.

97. The system of claim 96 wherein said means for iteratively positioning is manual.

98. The system of claim 94 wherein said means for determining one or more optimized or preferred configurations includes
means for changing at least one of
a) one or more components within said configuration of said communications network,
b) equipment settings of one or more components within said configuration of said communications network,
c) manufacturer of one or more components within said configuration of said communications network, and
d) orientation of one or more components within said configuration of said communications network; and
means for determining predicted or measured parameters for said communications network within said site generated by said means for configuring and said means for changing.

99. The system of claim 98 wherein said means for determining determines measured parameters for said communications network.

100. The system of claim 99 further comprising means for inputting measured parameters into said computer representation configured by said means for configuring.

101. The system of claim 98 wherein said means for determining determines predicted parameters for said communications network.

102. The system of claim 94 wherein said one or more parameters of said desirable configuration established by said means establishing are selected from the group consisting of coverage, capacity, coverage for a specific user class, specific capacity for a user class, coverage for a subset of users, capacity for a subset of users, handoff rate, dropped call rate, blocked call rate, dropped packet rate, symbol error rate, symbol rate, acceptable coverage zones, throughput including average, peak, individual, group, class or subclass, bit error rate, packet error rate, frame error rate, signal level, quality of service, latency, signal-to-noise ratio, carrier-to-noise ratio, signal strength, RSSI, rms delay spread, position location, position location accuracy, interference levels, carrier to interference levels, and distortion.

103. The system of claim 94 wherein said one or more parameters of said desirable configuration established by said means for establishing are selected from the group consisting of installation cost information, equipment cost information, relative performance information, and maintenance cost information.

104. The system of claim 94 wherein said one or more parameters of said desirable configuration established by said means for establishing includes at least two different parameters for different subsets of users.

105. The system of claim 98 wherein said equipment settings of said one or more components within said configuration of said communications network, are selected from the group consisting of one or more of transmit power settings, input and output gain settings, channel settings frequency settings, bandwidth of transmitted or received signal, modulation schemes, data or symbol rate, protocol stack, coding, user priority settings or allowances, antenna pointing, antenna phasing parameters, and orientation of component.

106. The system of claim 94 wherein said means for displaying provides a two dimensional display.

107. The system of claim 94 wherein said means for displaying provides a three dimensional display.

108. The system of claim 98 wherein one or more objects in said site map are assigned properties which are considered by said means for determining predicted or measured parameters for said communications network.

109. The system of claim 108 wherein said properties are selected from the group consisting of attenuation, surface roughness, width, material, reflection coefficient, absorption, color, motion, scattering effects, weight, thickness, partition type and loss values.

110. The system of claim 94 wherein said site map includes at least one of external walls, internal walls, cubicle walls, doors, ceilings, floors, furniture and windows, of at least part of one building.

111. The system of claim 94 wherein one or more components of said plurality of components are selected from the group consisting of base stations, base station controllers, amplifiers, attenuators, antennas, coaxial cabling, fiber optic cabling, splitters, repeaters, transducers, converters, couplers, leaky feeder cables, hubs, switches, routers, firewalls, MIMO systems, sensors, power distribution lines, wiring, twisted pair cabling and wireless or other access points.

112. The system of claim 94 further comprising means for creating or maintaining records for said communications network.

113. The system of claim 94 wherein said records are selected from the group consisting of alarm records, malfunction records, equipment upkeep costs, equipment installation costs, predicted upkeep costs, equipment use costs, equipment maintenance history, depreciation records, tax records, equipment warranty information, licensing information, owner information, tenant information, vendor information, installer information, lessor information, lessee information, electronic equipment identifier information, bar code information, manufacturer information, event statistics, outage rates, internet protocol address information, wireless address information, and digital signature information.

114. The system of claim 94 wherein said one or more parameters of said desirable configuration are selected from radio signal strength intensity, connectivity, network throughput, bit error rate, frame error rate, signal-to-interference ratio, signal-to-noise ratio, frame resolution per second, traffic, capacity, signal strength, throughput, error rates, packet latency, packet jitter, symbol jitter, quality of service, security, coverage area, bandwidth, server identification parameters, transmitter identification parameters, best server locations, transmitter location parameters, billing information, network performance parameters, C/I, C/N, body loss, height above floor, height above ground, noise figure, secure coverage locations, propagation loss factors, angle of arrival, multipath components, multipath parameters, antenna gains, noise level, reflectivity, surface roughness, path loss models, attenuation factors, throughput performance metrics, packet error rate, round trip time, dropped packet rate, queuing delay, signal level, interference level, quality of service, bandwidth delay product, handoff delay time, signal loss, data loss, number of users serviced, user density, locations of adequate coverage, handoff locations, locations of adequate throughput, E,I, system performance parameters, equipment price, maintenance and cost information, user class or subclass, user type, position location, position location accuracy, all in either absolute or relative terms.

115. The system of claim 94 further comprising an alarm which is activated when said measured parameters for said communications network determined by said means for determining is below a pre-established level.

116. The system of claim 115 wherein said alarm issues a page or a call or email alert.

117. The system of claim 115 wherein said alarm triggers a shut down or reduction in power or data rates in the communications network.

118. The system of claim 115 further comprising means for responding to said alarm.

119. The system of claim 94 further comprising an alarm which is activated in response to a self test of at least one of said plurality of components.

120. The system of claim 119 further comprising a means for automatically performing said self test.

121. The system of claim 94 further comprising a means for performing a diagnostic routine on at least one of said plurality of components which are used in the communications network, and means for reporting results of said diagnostic routine to said means for determining.

122. The system of claim 94 wherein said means for changing automatically changes in an iterative process a type of component of said one or more components.

123. The system of claim 94 wherein said means for changing manually changes in an iterative process a type of component of said one or more components.

124. The system of claim 94 wherein said means for changing automatically changes in an iterative process a manufacturer of said one or more components.

125. The system of claim 94 wherein said means for changing manually changes in an iterative process a manufacturer of said one or more components.

126. The system of claim 94 wherein said means for changing automatically changes in an iterative process a location of a component of said one or more components.

127. The system of claim 94 wherein said means for changing manually changes in an iterative process a location of a component of said one or more components.

128. The system of claim 94 wherein said means for changing automatically changes in an iterative process one of transmission power, channel, and frequency of a component of said one or more components.

129. The system of claim 94 wherein said means for changing manually changes in an iterative process one of transmission power, channel, frequency, transmit power, bandwidth, data rate, antenna type, antenna sector or positioning, modulation or coding type, protocol, switching in a spare component, resetting one or more equipments with alternate settings of a component of said one or more components.

130. The system of claim 94 wherein said means for changing automatically changes in an iterative process an orientation of a component of said one or more components.

131. The system of claim 94 wherein said means for changing manually changes in an iterative process an orientation of a component of said one or more components.

132. The system of claim 94 further comprising a means for obtaining measured performance data for equivalent components to at least one of said plurality of components in said communications network, wherein said equivalent components are used in another communications network.

133. The system of claim 132 wherein said performance data for equivalent components is stored in a relational database.

134. The system of claim 94 further comprising a means for obtaining at least one of performance data, cost data, maintenance data, and equipment settings for at least one of said components of said plurality of components from a relational database.

135. The system of claim 94 further comprising a means for obtaining at least one of performance data, cost data, maintenance data, and equipment settings for at least one of said components of said plurality of components from a source or sources on the Internet.

136. The system of claim 94 wherein said means for configuring includes a means for automatically identifying a set of possible locations for at least one of said plurality of components on said site map.

137. The system of claim 94 further comprising a feedback means for providing comparisons of measured parameters with predicted parameters.

138. The system of claim 94 wherein said feedback means is operated automatically over time.

139. A method for modeling a communications network, comprising:
displaying a site map of a site in which a communications network is or will be deployed;
identifying locations on said site map where placement of one or more components of said communications network are not desirable or are desirable;
establishing one or more parameters of a desirable configuration of said communications network;
configuring a computer representation on said site map on said display a possible configuration of a communications network which includes a plurality of said one or more components which are or may be used in the communications network, one or more of said components having at least one of performance data cost data, maintenance data and equipment settings stored in a database, said means for configuring positioning on said site map computer representations of said one or more components only at locations which are desirable and not at locations which are not desirable; and
determining one or more optimized or preferred configurations of said communications network based on a comparison of predicted or measured parameters for a configuration generated by said means for configuring with said one or more parameters of said desirable configuration established in said establishing step.

140. The method of claim 139 wherein said configuring step includes the step of iteratively positioning a computer representation of at least one component of said one or more components at a plurality of desirable locations identified in said identifying step.

141. The method of claim 140 wherein said iteratively positioning step is automated.

142. The method of claim 140 wherein said iteratively positioning step is manual.

143. The method of claim 139 wherein said determining one or more optimized or preferred configurations step includes
changing at least one of
a) one or more components within said configuration of said communications network,
b) equipment settings of one or more components within said configuration of said communications network,
c) manufacturer of one or more components within said configuration of said communications network, and
d) orientation of one or more components within said configuration of said communications network; and
determining predicted or measured parameters for said communications network within said site generated in said configuring step and changes generated in said changing step.

144. The method of claim 143 wherein said determining step determines measured parameters for said communications network.

145. The method of claim 144 further comprising the step of inputting measured parameters into said computer representation configured in said configuring step.

146. The method of claim 143 wherein said determining step determines predicted parameters for said communications network.

147. The method of claim 139 wherein said one or more parameters of said desirable configuration established in said establishing step are selected from the group consisting of coverage, capacity, coverage for a specific user class, specific capacity for a user class, coverage for a subset of users, capacity for a subset of users, handoff rate, dropped call rate, blocked call rate, dropped packet rate, symbol error rate, symbol rate, acceptable coverage zones, throughput including average, peak, individual, group, class or subclass, bit error rate, packet error rate, frame error rate, signal level, quality of service, latency, signal-to-noise ratio, carrier-to-noise ratio, signal strength, RSSI, rms delay spread, position location, position location accuracy, interference levels, carrier to interference levels, and distortion.

148. The method of claim 139 wherein said one or more parameters of said desirable configuration established in said establishing step are selected from the group consisting of installation cost information, equipment cost information, relative performance information, and maintenance cost information.

149. The method of claim 139 wherein said one or more parameters of said desirable configuration established in said establishing step includes at least two different parameters for different subsets of users.

150. The method of claim 139 wherein said equipment settings of said one or more components within said configuration of said communications network, are selected from the group consisting of one or more of transmit power settings, input and output gain settings, channel settings frequency settings, bandwidth of transmitted or received signal, modulation schemes, data or symbol rate, protocol stack, coding, user priority settings or allowances, antenna pointing, antenna phasing parameters, and orientation of component.

151. The method of claim 139 wherein said displaying step provides a two dimensional display.

152. The method of claim 139 wherein said displaying step provides a three dimensional display.

153. The method of claim 143 wherein one or more objects in said site map are assigned properties which are considered in said determining step for determining predicted or measured parameters for said communications network.

154. The method of claim 153 wherein said properties are selected from the group consisting of attenuation, surface roughness, width, material, reflection coefficient, absorption, color, motion, scattering effects, weight, thickness, partition type and loss values.

155. The method of claim 139 wherein said site map includes at least one of external walls, internal walls, cubicle walls, doors, ceilings, floors, furniture and windows, of at least part of one building.

156. The method of claim 139 wherein one or more components of said plurality of components are selected from the group consisting of base stations, base station controllers, amplifiers, attenuators, antennas, coaxial cabling, fiber optic cabling, splitters, repeaters, transducers, converters, couplers, leaky feeder cables, hubs, switches, routers, firewalls, MIMO systems, sensors, power distribution lines, wiring, twisted pair cabling and wireless and other access points.

157. The method of claim 139 further comprising the step of creating or maintaining records for said communications network.

158. The method of claim 139 wherein said records are selected from the group consisting of alarm records, malfunction records, equipment upkeep costs, equipment installation costs, predicted upkeep costs, equipment use costs, equipment maintenance history, depreciation records, tax records, equipment warranty information, licensing information, owner information, tenant information, vendor information, installer information, lessor information, lessee information, electronic equipment identifier information, bar code information, manufacturer information, event statistics, outage rates, internet protocol address information, wireless address information, and digital signature information.

159. The method of claim 139 wherein said one or more parameters of said desirable configuration are selected from radio signal strength intensity, connectivity, network throughput, bit error rate, frame error rate, signal-to-interference ratio, signal-to-noise ratio, frame resolution per second, traffic, capacity, signal strength, throughput, error rates, packet latency, packet jitter, symbol jitter, quality of service, security, coverage area, bandwidth, server identification parameters, transmitter identification parameters, best server locations, transmitter location parameters, billing information, network performance parameters, C/I, C/N, body loss, height above floor, height above ground, noise figure, secure coverage locations, propagation loss factors, angle of arrival, multipath components, multipath parameters, antenna gains, noise level, reflectivity, surface roughness, path loss models, attenuation factors, throughput performance metrics, packet error rate, round trip time, dropped packet rate, queuing delay, signal level, interference level, quality of service, bandwidth delay product, handoff delay time, signal loss, data loss, number of users serviced, user density, locations of adequate coverage, handoff locations, locations of adequate throughput, E,I, system performance parameters, equipment price, maintenance and cost information, user class or subclass, user type, position location, position location accuracy, all in either absolute or relative terms.

160. The method of claim 143 further comprising the step of activating an alarm when said measured parameters for said communications network determined by said means for determining is below a pre-established level.

161. The method of claim 160 wherein said alarm issues a page or a call or email alert.

162. The method of claim 160 wherein said alarm triggers a shut down or reduction in power or data rates in the communications network.

163. The method of claim 160 further comprising the step of responding to said alarm.

164. The method of claim 139 further comprising the step of activating an alarm in response to a self test of at least one of said plurality of components.

165. The method of claim 164 further comprising the step of automatically performing said self test.

166. The method of claim 143 further comprising the step of performing a diagnostic routine on at least one of said plurality of components which are used in the communications network, and reporting results of said diagnostic routine.

167. The method of claim 143 wherein said changing step automatically changes in an iterative process a type of component of said one or more components.

168. The method of claim 143 wherein said changing step manually changes in an iterative process a type of component of said one or more components.

169. The method of claim 143 wherein said changing step automatically changes in an iterative process a manufacturer of said one or more components.

170. The method of claim 143 wherein said changing step manually changes in an iterative process a manufacturer of said one or more components.

171. The method of claim 143 wherein said changing step automatically changes in an iterative process a location of a component of said one or more components.

172. The method of claim 143 wherein said changing step manually changes in an iterative process a location of a component of said one or more components.

173. The method of claim 143 wherein said changing step automatically changes in an iterative process one of transmission power, channel, frequency, transmit power, bandwidth, data rate, antenna type, antenna sector or positioning, modulation or coding type, protocol, switching in a spare component, resetting one or more equipments with alternate settings of a component of said one or more components.

174. The method of claim 143 wherein said changing step manually changes in an iterative process one of transmission power, channel, frequency, transmit power, bandwidth, data rate, antenna type, antenna sector or positioning, modulation or coding type, protocol, switching in a spare component, resetting one or more equipments with alternate settings of a component of said one or more components.

175. The method of claim 143 wherein said changing step automatically changes in an iterative process an orientation of a component of said one or more components.

176. The method of claim 143 wherein said changing step manually changes in an iterative process an orientation of a component of said one or more components.

177. The method of claim 139 further comprising the step of adjusting equipment settings of one or more components in said communications network in response to said alarm.

178. The method of claim 177 wherein said step of adjusting is activated automatically in response to said alarm.

179. The method of claim 177 wherein said means for adjusting adjusts at least one of transmit power, channel, frequency, bandwidth, modulation, coding type, protocol, data rate, switching in a spare component, resetting, and changing settings of one or more components of said plurality of components in said communications network.

180. The method of claim 178 wherein said step of adjusting is performed automatically in response to said alarm.

181. The method of claim 178 wherein said adjusting step adjusts at least one of transmit power, channel, frequency, bandwidth, modulation, coding type, protocol, data rate, switching in a spare component, resetting, and changing settings of one or more components of said plurality of components in said communications network.

182. The method of claim 139 further comprising the step of obtaining measured performance data for equivalent components to at least one of said plurality of components in said communications network, wherein said equivalent components are used in another communications network.

183. The method of claim 182 wherein said performance data for equivalent components is stored in a relational database.

184. The method of claim 143 further comprising the step of obtaining at least one of performance data, cost data, maintenance data, and equipment settings for at least one of said components of said plurality of components from a relational database.

185. The method of claim 143 further comprising the step of obtaining at least one of performance data, cost data, maintenance data, and equipment settings for at least one of said components of said plurality of components from a source or sources on the Internet.

186. The method of claim 143 wherein said configuring step includes the step of automatically identifying a set of possible locations for at least one of said plurality of components on said site map.

187. The method of claim 143 further comprising the step of providing feedback for providing comparisons of measured parameters with predicted parameters.

188. The method of claim 87 wherein said feedback means is operated automatically over time.

189. The system of claim 1 wherein said means for changing manually changes in an iterative process one of transmit power, channel or frequency, bandwidth, data rate, antenna type, antenna sector or positioning, modulation or coding type, protocol, data rate, switching in a spare component, resetting, or changing settings of a component of said one or more components.

* * * * *